United States Patent
West et al.

(10) Patent No.: US 10,140,175 B2
(45) Date of Patent: *Nov. 27, 2018

(54) PROTECTING AN ECC LOCATION WHEN TRANSMITTING CORRECTION DATA ACROSS A MEMORY LINK

(71) Applicant: QUALCOMM Incorporated, San Diego, CA (US)

(72) Inventors: David Ian West, San Diego, CA (US); Jungwon Suh, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 212 days.

This patent is subject to a terminal disclaimer.

(21) Appl. No.: 15/081,460

(22) Filed: Mar. 25, 2016

(65) Prior Publication Data

US 2017/0147431 A1  May 25, 2017

Related U.S. Application Data

(60) Provisional application No. 62/258,155, filed on Nov. 20, 2015.

(51) Int. Cl.
| | | |
|---|---|---|
| G11C 29/00 | (2006.01) | |
| G06F 11/10 | (2006.01) | |
| G06F 3/06 | (2006.01) | |
| G11C 29/52 | (2006.01) | |

(52) U.S. Cl.
CPC .......... *G06F 11/1068* (2013.01); *G06F 3/064* (2013.01); *G06F 3/0619* (2013.01); *G06F 3/0659* (2013.01); *G06F 3/0679* (2013.01); *G06F 11/1048* (2013.01); *G11C 29/52* (2013.01)

(58) Field of Classification Search
CPC .. G06F 11/10; G06F 11/1048; G06F 11/1068; G06F 12/00; G06F 3/0619; G06F 3/064; G06F 3/0659; G06F 3/0679; G11C 29/00; G11C 29/52; G11C 7/1006
See application file for complete search history.

(56) References Cited

U.S. PATENT DOCUMENTS

| | | | | |
|---|---|---|---|---|
| 7,987,229 B1 * | 7/2011 | Kinne | ............ | H04L 67/1097 709/200 |
| 8,082,482 B2 * | 12/2011 | Gower | ............ | G06F 11/1008 365/201 |
| 8,209,587 B1 * | 6/2012 | Taylor | ............ | G06F 11/1096 711/114 |
| 8,397,129 B2 | 3/2013 | Schreck et al. | | |
| 8,417,987 B1 * | 4/2013 | Goel | ............ | G06F 11/1076 714/6.1 |

(Continued)

OTHER PUBLICATIONS

International Search Report and Written Opinion—PCT/US2016/054162—ISA/EPO—dated Dec. 15, 2016.

*Primary Examiner* — Albert Decady
*Assistant Examiner* — Enamul M Kabir
(74) *Attorney, Agent, or Firm* — Seyfarth Shaw LLP

(57) ABSTRACT

A memory sub-system may include a memory controller having error correction code (ECC) encoder/decoder logic. The memory controller may be configured to embed link ECC parity bits in unused data mask bits and/or in a mask write data during a mask write operation. The memory controller may also be configured to protect at least a location of the link ECC parity bits during the mask write operation.

30 Claims, 16 Drawing Sheets

(56) References Cited

U.S. PATENT DOCUMENTS

| | | | |
|---|---|---|---|
| 8,837,241 B2 | 9/2014 | Takahashi | |
| 8,959,417 B2 | 2/2015 | Zhu et al. | |
| 2004/0068612 A1* | 4/2004 | Stolowitz | G06F 11/1076 |
| | | | 711/114 |
| 2004/0129952 A1* | 7/2004 | Griesmer | G11C 8/20 |
| | | | 257/202 |
| 2008/0005646 A1 | 1/2008 | Bains | |
| 2012/0191907 A1* | 7/2012 | Bains | G06F 13/4243 |
| | | | 711/105 |
| 2013/0024744 A1 | 1/2013 | Takizawa | |
| 2014/0177362 A1* | 6/2014 | O'Connor | G06F 11/1052 |
| | | | 365/201 |
| 2014/0317470 A1 | 10/2014 | Chung et al. | |
| 2015/0378826 A1* | 12/2015 | Zhang | H03M 13/2942 |
| | | | 714/766 |
| 2017/0063401 A1* | 3/2017 | Jeganathan | H03M 13/2909 |

* cited by examiner

| | | | | | | | | | | | | | | | | |
|---|---|---|---|---|---|---|---|---|---|---|---|---|---|---|---|---|
| DQ0 | D0 | D8 | E0 | D24 | D32 | D40 | D48 | D56 | D64 | D72 | D80 | D88 | D96 | D104 | D112 | D120 |
| DQ1 | D1 | D9 | E1 | D25 | D33 | D41 | D49 | D57 | D65 | D73 | D81 | D89 | D97 | D105 | D113 | D121 |
| DQ2 | D2 | D10 | E2 | D26 | D34 | D42 | D50 | D58 | D66 | D74 | D82 | D90 | D98 | D106 | D114 | D122 |
| DQ3 | D3 | D11 | E3 | D27 | D35 | D43 | D51 | D59 | D67 | D75 | D83 | D91 | D99 | D107 | D115 | D123 |
| DQ4 | D4 | D12 | E4 | D28 | D36 | D44 | D52 | D60 | D68 | D76 | D84 | D91 | D100 | D108 | D116 | D124 |
| DQ5 | D5 | D13 | E5 | D29 | D37 | D45 | D53 | D61 | D69 | D77 | D85 | D92 | D101 | D109 | D117 | D125 |
| DQ6 | D6 | D14 | E6 | D30 | D38 | D46 | D54 | D62 | D70 | D78 | D86 | D93 | D102 | D110 | D118 | D123 |
| DQ7 | D7 | D15 | E7 | D31 | D39 | D47 | D55 | D63 | D71 | D79 | D87 | D94 | D103 | D111 | D119 | D127 |
| DM0 | L | L | H | L | H | L | L | L | E8 | E9 | E10 | E11 | E12 | E13 | E14 | 15 |

64bit Data with 8bit ECC Parity bits (310, 312)
64bit Data with 8bit ECC Parity bits (320, 324)
Burst Data (Burst Length = 16)

330

PROTECTING AN ECC LOCATION WHEN TRANSMITTING CORRECTION DATA ACROSS A MEMORY LINK

CROSS-REFERENCE TO RELATED APPLICATION

This application claims the benefit under 35 U.S.C. § 119(e) to U.S. Provisional Patent Application No. 62/258,155, entitled "PROTECTING AN ECC LOCATION WHEN TRANSMITTING CORRECTION DATA ACROSS A MEMORY LINK," filed on Nov. 20, 2015, the disclosure of which is expressly incorporated by reference herein in its entirety.

BACKGROUND

Field

The present disclosure generally relates to integrated circuits (ICs). More specifically, one aspect of the present disclosure relates to protecting an error correction code (ECC) location when transmitting correction data across a memory link in a low power memory sub-system.

Background

Semiconductor memory devices include, for example, static random access memory (SRAM) and dynamic random access memory (DRAM). A DRAM memory cell generally includes one transistor and one capacitor, which enables a high degree of integration. The capacitor can be either charged or discharged to store information as a corresponding bit value (e.g., '0' or '1'). Because capacitors leak charge, the stored information eventually fades unless the capacitor charge is refreshed. Thus, periodic refreshes occur. Due to the refresh requirement, DRAM is referred to as dynamic memory as opposed to SRAM and other static memory. The continuous refreshing of DRAM generally limits its use to computer main memory.

DRAM scaling continues to increase the total number of bits for each DRAM chip. Unfortunately, DRAM scaling increases the number of weak retention cells (e.g., cells that have a reduced retention time). Such cells involve additional refresh cycles to maintain the stored information. Advanced DRAM processes may suffer additional random bit refresh errors within a memory cell array due to the additional refresh cycles or other process variations.

Some low power memories implement error correction codes (ECCs) to improve memory yield and reliability by applying ECCs to any random bit error in the memory cell array. ECC decoding and error correction, however, degrade memory performance due to an increased read access time. In addition, a memory link (e.g., interface) is not protected by the ECCs, and the overall memory reliability is insufficient for meeting high reliability and high performance system memory requirements.

SUMMARY

A method of link error correction and protection in a low power memory sub-system may include embedding link error correction code (ECC) parity bits in unused data mask bits and/or in a mask write data during a mask write operation. The method may also include protecting at least a location of the link ECC parity bits during the mask write operation.

A memory sub-system may include a memory controller having error correction code (ECC) encoder/decoder logic. The memory controller may be configured to embed link ECC parity bits in unused data mask bits and/or in a mask write data during a mask write operation. The memory controller may also be configured to protect at least a location of the link ECC parity bits during the mask write operation.

A memory sub-system may include a memory controller having error correction code (ECC) encoder/decoder logic. The ECC encoder/decoder logic may be configured to embed link ECC parity bits in unused data mask bits and/or in a mask write data during a mask write operation. The encoder/decoder logic may also be configured to protect at least a location of the link ECC parity bits during the mask write operation. The memory sub-system may also include a memory device coupled to the memory controller via a data bus. The memory device may include link ECC decoder and correction logic in a write path. The link ECC decoder may be configured for detection and correction of link errors during transmission of write data over the data bus. The memory device may include memory ECC encoder logic in the write path. The memory ECC encoder logic may be configured for memory protection of the write data during storage within a memory array according to memory ECC parity bits.

A memory sub-system may include means for embedding link error correction code (ECC) parity bits in unused data mask bits and/or in mask write data during a mask write operation. The low power memory sub-system may also include means for protecting at least a location of the link ECC parity bits during the mask write operation.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

FIGS. 2A and 2B are timing diagrams illustrating communication of error correction code parity bits during a normal write command according to aspects of the disclosure.

FIGS. 3A to 3C are timing diagrams illustrating various options for transferring link error correction code (ECC) parity bits between a host system on chip (SoC) and low power memory devices during a mask write (MWT) command according to aspects of the present disclosure.

DETAILED DESCRIPTION

Figure 1:
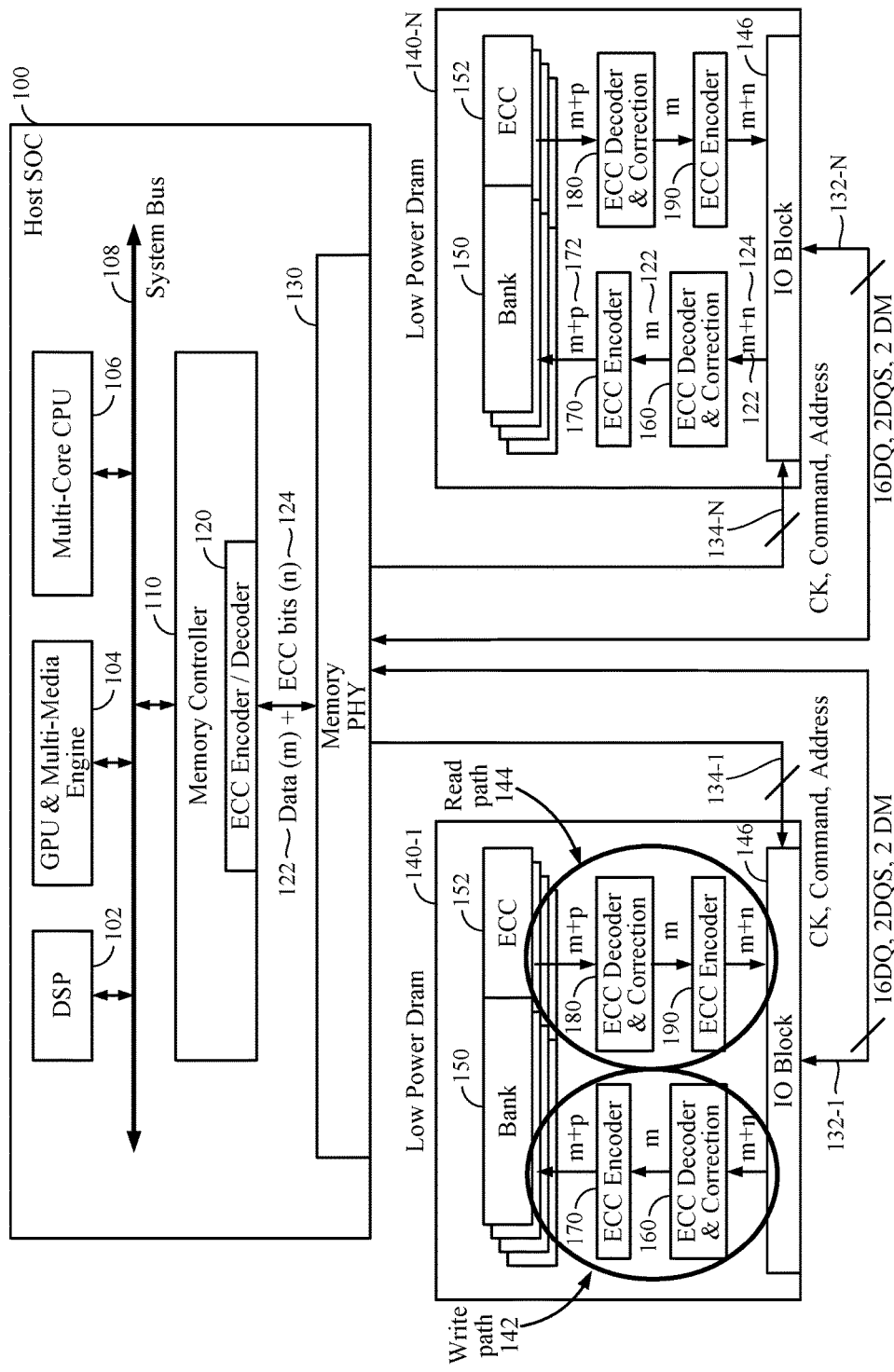
FIG. 1 shows a top view of a low power memory sub-system illustrating a host system on chip (SoC) communicably coupled to low power memory devices in accordance with aspects of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Semiconductor memory devices include, for example, static random access memory (SRAM) and dynamic random access memory (DRAM). A DRAM memory cell generally includes one transistor and one capacitor, which enables a high degree of integration. The capacitor can be either charged or discharged to store information as a corresponding bit value (e.g., '0' or '1'). Because capacitors leak charge, the stored information eventually fades and the capacitor charge is refreshed periodically. Due to the refresh requirement, DRAM is referred to as dynamic memory as opposed to SRAM and other static memory. The continuous refreshing of DRAM generally limits DRAM to being used as computer main memory.

DRAM scaling continues to increase the total number of bits for each DRAM chip. Unfortunately, DRAM scaling increases the number of weak retention cells (e.g., cells that have a reduced retention time). Such cells involve additional refresh cycles to maintain the stored information. Advanced DRAM processes may suffer additional random bit refresh errors within a memory cell array due to the additional refresh cycles or other process variations. Some low power memories implement error correction codes (ECCs) to improve memory yield and reliability by applying ECCs to any random bit errors in the memory cell array.

For example, server and computing systems can use a wide (e.g., 72-bit input/output (TO) width) memory module to enhance reliability of a memory link and a memory cell array. Because memory failure within a server computing system is intolerable, reliability of the memory link is enhanced by applying ECCs to memory operations. Storage of the ECCs, however, involves an additional device. For example, in a 72-bit IO width memory module, an 8-bit ECC is assigned to each 64-bit data block of eight memory devices. Assigning an 8-bit ECC to each 64-bit data block provides protection against bit errors in both the memory interface and the memory cell array.

In the 72-bit IO width memory module, however, a ninth 64-bit (ECC) memory device is used to store the eight 8-bit ECCs assigned to each 64-bit data block of the eight memory devices. Unfortunately, this memory configuration increases memory system cost and memory power. In particular, this memory configuration involves additional printed circuit board (PCB) area and cost for supporting a wider memory channel due to the ECC memory device. The ECC memory device also involves standby and active power, which increases the cost associated with this memory configuration.

One technique for protecting both a memory array and link includes the transfer of ECC bits between a host (e.g., a system on chip (SoC)) and low power memories. The ECC bits may be transferred by extending a data burst length (e.g., a 16-bit burst length extended to an 18-bit burst length). Unfortunately, the extended burst length causes significant memory performance loss by reducing net memory bandwidth. Some low power memories implement ECCs to improve memory yield and reliability by applying ECCs to any random bit error in the memory cell array. ECC decoding and error correction within the memory device, however, degrade memory performance due to an increased read access time. In addition, a memory link (e.g., interface) is not protected by the ECCs, and the overall memory reliability is insufficient for meeting high reliability and high performance system memory specifications.

Aspects of the disclosure relate to a memory sub-system including a host system on chip (SoC) and multiple memory devices. The memory controller includes an error correction code (ECC) encoding and decoding block to generate link ECC bits for protecting write data against memory link error and to correct any data failure caused by the memory link. The memory devices each have a cell array for data and an ECC array for memory ECC parity bits to correct any random bit errors caused by the memory array of the memory devices. These memory ECC parity bits are generated based on a proprietary methodology of the memory device manufacturer that is different from a non-proprietary methodology of the host SoC used to generate the link ECC parity bits.

In aspects of the present disclosure, the link ECC parity bits are generated to protect write data against link errors during transmission over a memory link (e.g., a data bus), and memory ECC parity bits are generated to protect write data within the memory devices against random bit errors within the memory cell arrays of the memory devices. In some aspects of the disclosure, the link ECC parity bits may be transferred between a host and the memory devices through a data mask pin or a data byte associated with a mask write (MWT) command. In the case of a mask write operation, a memory device recovers the link ECC parity bits associated with the first asserted data mask (DM) bit (e.g., "H"), in which the mask write command bit fields indicate DM activity for an "m" bit data pattern. In the case of a normal write operation, the memory device recovers the link ECC bits from the DM data stream.

Aspects of the present disclosure describe techniques in which the link ECC parity bits are transmitted over the data (DQ) pins or the data mask (DM) pins during a masked write operation. Unfortunately, when a bit error occurs on the DM bit marking the location of link ECC parity, the bit error results in the wrong column being decoded and a failure of the link ECC parity bits. In aspects of the present disclosure, masked write operations are expanded to protect both the write data using the link ECC parity bits, but also the location of the link ECC parity bits. In normal write operations, the location of the link ECC data is always known and predictable. In a read operation, the memory controller may recover memory/link ECC parity bits within the DM data stream from the memory device.

In a masked write operation, however, the location of the link ECC parity bits varies based on the number of masked bytes. In one aspect of the present disclosure, information about the location of the link ECC parity bits may be either protected or communicated separately on a lower speed line. In this aspect of the disclosure, the mask write command is followed by data mask (DM) ECC parity bits to protect the DM pins in the write data burst. In another aspect of the present disclosure, a location of the ECC parity bits is transmitted with the mask write command to indicate the location in which the link ECC parity bits are embedded in the write data burst.

FIG. 1 shows a top view of a low power memory sub-system illustrating a host system on chip (SoC) 100 coupled to memory devices 140 (140-1, . . . , 140-N) in accordance with aspects of the present disclosure. This aspect of the present disclosure applies link error correction code (ECC) parity bits to a low power memory sub-system in mobile or computing systems to protect the memory link (e.g., data bus) from random bit errors during transmission over the memory link. More specifically, aspects of the present disclosure may supplement next generation low power double data rate (DDR) specifications and memory controller implementations in mobile or computing system chipsets in which the memory devices use proprietary memory ECC parity bits to protect the memory cell arrays from random bit errors.

Representatively, the host SoC 100 includes various processing units that support multi-threaded operation. For the configuration shown in FIG. 1, the host SoC 100 includes a digital signal processor (DSP) 102, a graphics processor unit (GPU) and multi-media engine 104, a multi-core central processing unit (CPU) 106, a system bus 108, a memory controller 110, and a memory physical layer (PHY) 130. The DSP 102, the GPU and multi-media engine 104 and the multi-core CPU 106 support various functions such as video, audio, graphics, gaming, and the like. Each processor core of the multi-core CPU 106 may be a reduced instruction set computing (RISC) machine, a microprocessor, or some other type of processor.

In this aspect of the disclosure, the host SoC 100 is communicably coupled to memory devices 140 (e.g., low power dynamic random access memory (DRAM)) through the memory PHY 130. In this configuration, the memory controller 110 includes error correction code (ECC) encoder/decoder logic 120 to generate link ECC parity bits 124 for data 122 (e.g., read/write data) communicated to one of the memory devices 140 through the memory PHY 130 along a data bus 132 (132-1, . . . , 132-N) and a command/address bus 134 (134-1, . . . , 134-N), which may be collectively referred to as the memory link. The link ECC parity bits 124 generated by the ECC encoder/decoder logic 120 enable correction of any data failure caused by the memory link (e.g., data bus 132) at the memory devices 140.

As the host SoC 100 increases the memory link serial data rate from, for example, thirty-two hundred (3200) megabits per second (Mbps) to sixty-four hundred (6400) Mbps, protection against memory link errors becomes more of a concern. In this configuration, the link ECC parity bits 124 ("n" bit ECC) are generated by the memory controller 110 to protect the data 122 (e.g., "m" bit write) from random bit errors during transmission over the data bus 132. Because both the link ECC parity bits 124 and the data 122 are transferred between the host SoC 100 and the memory devices 140 during write and read operations, any memory link errors can be detected and corrected with the link ECC parity bits 124. Also, any random bit error during transmission from the memory cell arrays 150 can be corrected in the ECC encoder/decoder logic 120 of the memory controller 110.

In this configuration, the memory devices 140 include the memory cell arrays 150 (e.g., memory banks) for storing the data 122 and the ECC arrays 152 for storing memory ECC parity bits 154. In this aspect of the present disclosure, the memory devices 140 include memory ECC encoder logic 170 configured to generate memory ECC parity bits 172 to enable detection and correction of any random bit errors caused by the memory cell arrays 150 of the memory devices 140 during storage of the data 122. The data 122 is stored in one of the memory cell arrays 150 (e.g., memory banks), and the memory ECC parity bits 172 are stored in the ECC arrays 152. Also, any random bit error in the memory cell arrays 150 can be corrected in the memory ECC decoder and correction logic 180 of the memory devices 140 based on a proprietary algorithm of the memory device manufacturer different from a non-proprietary algorithm of the host SoC 100 used to generate the link ECC parity bits 124.

The link ECC parity bits 124 from the memory controller 110 may be received by the memory devices 140 through a data mask pin for a data byte associated with a mask write command. The location of the link ECC parity bits 124 may be communicated to the memory devices 140 using ECC bit location (EL) information. This process is performed during a mask write (MWT) operation, in which the memory devices 140 recover the link ECC parity bits 124 when a first data mask (DM) bit is asserted (e.g., "H") and the MWT command bit fields indicate DM activity in accordance with the data 122. During a normal write operation, the memory devices 140 may recover the link ECC parity bits 124 from a DM data stream.

In this configuration, the memory devices 140 include an input/output (IO) block 146 communicably coupled to the data bus 132 and the command/address bus 134. In operation, the link ECC parity bits 124 generated by the memory controller 110 according to a non-proprietary methodology of the host SoC 100 may be used by a link ECC decoder and correction logic 160 of the memory devices 140 to detect and correct link errors within the data 122. In this aspect of the present disclosure, the memory devices 140 include memory ECC encoder logic 170 configured to generate memory ECC parity bits 172 to enable detection and correction of any random bit errors during storage of the data 122. Accordingly, once the data 122 is corrected and/or verified, memory ECC parity bits 172 are generated within the memory ECC encoder logic 170 along a write path 142 of the memory devices 140 to protect the data 122 against random bit errors during storage.

During operation, the data 122 is stored in one of the memory cell arrays 150 (e.g., memory banks), and the memory ECC parity bits 172 are stored in the ECC arrays 152. In this configuration, any random bit error in the memory cell arrays 150 can be corrected in the memory ECC decoder and correction logic 180 of the memory devices 140 based on a proprietary algorithm of the memory device manufacturer using the memory ECC parity bits 172 stored within the ECC arrays 152. Accordingly, once the data 122 is corrected and/or verified, link ECC parity bits 124 are generated within the link ECC encoder logic 190 along the read path 144 of the memory devices 140 to protect the data 122 against random bit errors during transmission over the data bus 132.

In this aspect of the disclosure, the host SoC 100 is able to detect and correct any memory link errors using the link ECC parity bits 124 that may be caused by the increased memory link serial data rate (e.g., from 3200 Mbps to 6400 Mbps). Additionally, any random bit error in the memory cell arrays 150 can be corrected by the memory ECC decoder and correction logic 180 of the memory devices 140 using the memory ECC parity bits 172. The use of the memory ECC decoder and correction logic 180 and the link ECC encoder logic 190 along the read path 144 of the memory devices 140 may lead to undesirable read latency. Alternatively, the functionality of the memory ECC decoder and correction logic 180 and/or the link ECC encoder logic 190 are incorporated into the memory controller to reduce read latency.

In the memory devices 140 shown in FIG. 1, an entire memory line (e.g., a 256-bit word) is generally read from the memory array during a write operation. During a mask write operation, the memory ECC encoder logic 170 executes a read-modify-write operation within one of the memory cell arrays 150 to perform ECC encoding with read and write data (masked data bytes are replaced with the corresponding data bytes in one of the memory cell arrays 150). That is, the mask write operation enables updating of selected bytes of the memory line, such that the masked data bytes are not written to the memory cell arrays 150. In operation, an extra pin (e.g., a data mask bit) is sent along with the data 122 to remove designated write data and limit the read-modify-write operation by designating the write data bytes that are ignored.

Figure 2A:
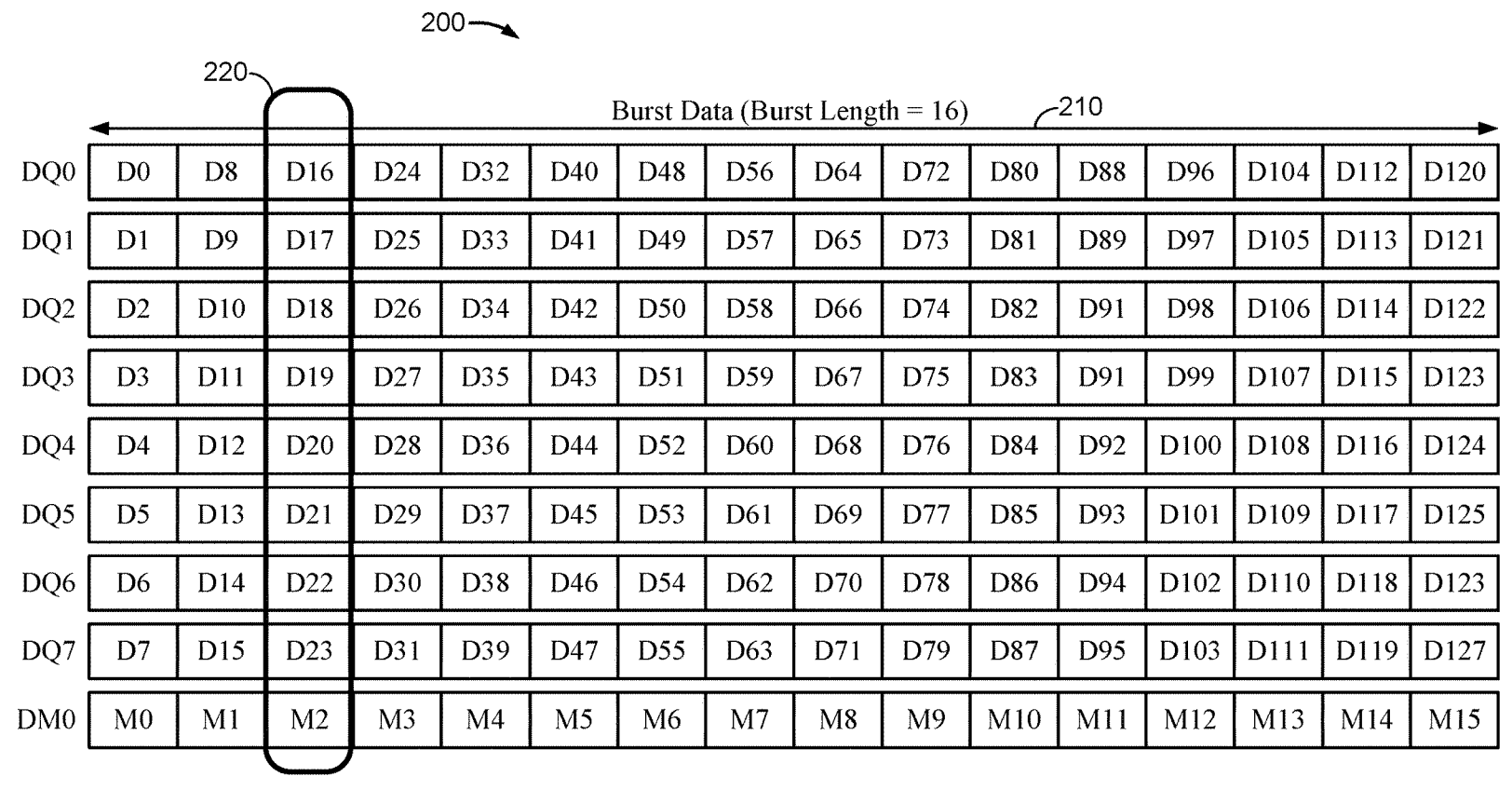

FIG. 2A is a timing diagram 200 illustrating a mask write (MWT) command for, for example, a 128-bit write data burst 210 having an associated 16-bit data mask with a burst length equal to 16. In the timing diagram 200, "D" refers to write data, and "M" refers to data mask bits, with one data mask bit assigned for each DQ byte. In this example, the M2 bit of the DM0 pin associated with a write data D<16:23> is asserted (e.g., "High" or "H"). As a result, mask write data 220 (e.g., write data D<16:23>) is not written to a target one of the memory cell arrays 150 (FIG. 1). In response to the mask write command, the target one of the memory devices 140 executes a read operation from one of the memory cell arrays 150 and replaces the mask write data 220 with read data Q<16:23> to form the write data (e.g., 128-bit write data) for memory ECC encoding using the memory ECC encoder logic 170. The memory ECC encoder logic 170 stores the 128-bit write data within the target one of the memory cell arrays 150, and memory ECC parity bits 172 are written to a target one of the ECC arrays 152.

In aspects of the present disclosure, ECC parity bits from the memory controller are transferred between the host SoC and the low power memories through a data mask pin or a data byte associated with a mask write command. The location of the ECC parity bits may be communicated to the memory devices using ECC bit location information. In the case of a mask write operation, the memory recovers ECC bits associated with the first asserted data mask (DM) bit (e.g., "H"), in which the mask write command bit fields indicate DM activity for each "m" bit data pattern. In case of a normal write operation, the memory devices recover the ECC bits from the DM data stream.

Figure 2B:
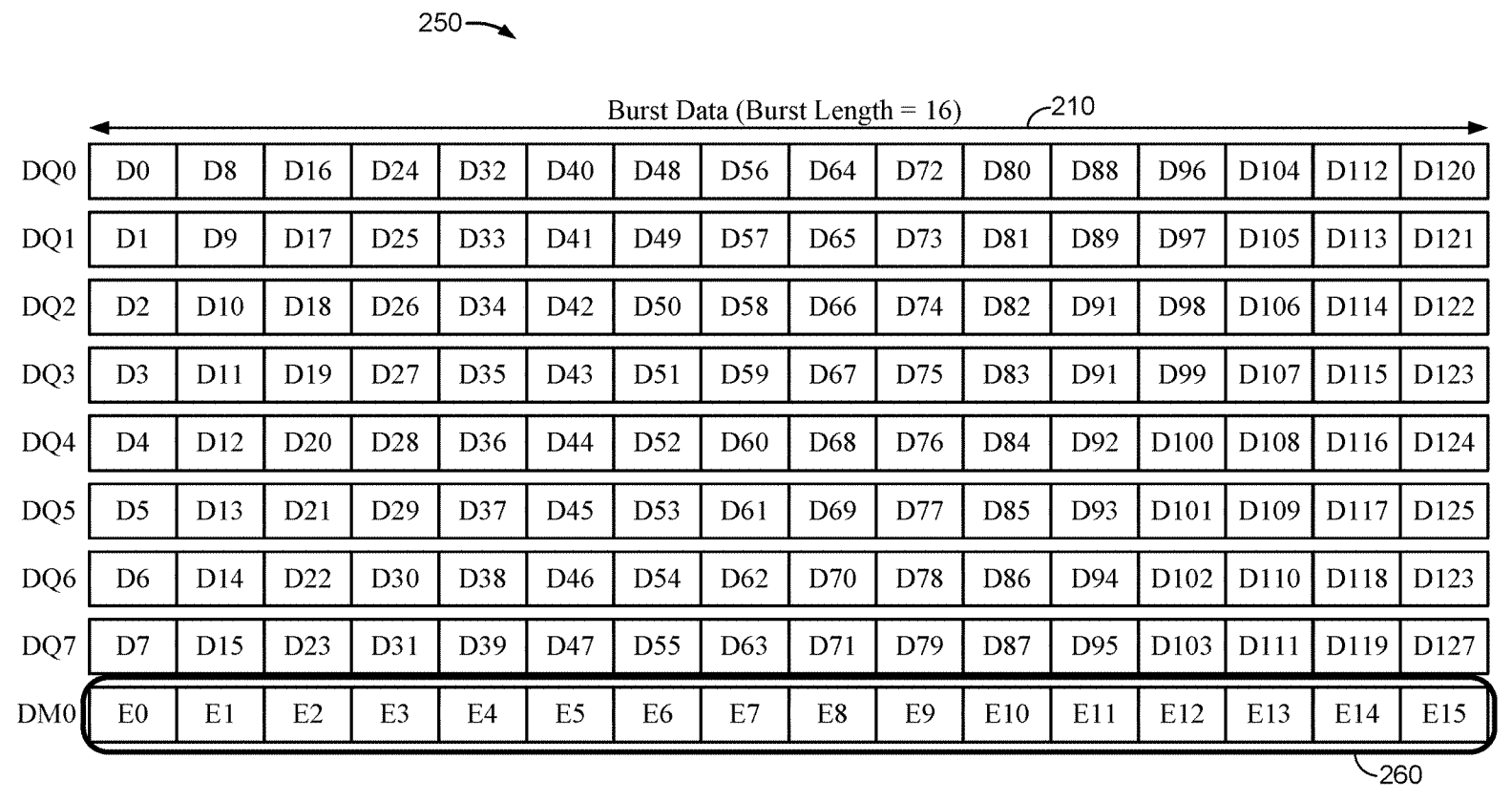

FIG. 2B is a timing diagram 250 illustrating a normal write command for, for example, a 128-bit write data burst 210 having an associated 16-bit data mask with a burst length equal to 16. Low power memory devices, such as the memory devices 140 (FIG. 1), have a normal write command separate from a mask write command. For a normal write command, all bits of the DM0 pin (E0, . . . , E15) associated with the 128-bit write data are de-asserted (e.g., "Low"). By contrast, for a mask write command, at least one DM bit is asserted "High" during a burst data stream (BL). As a result, the bits of the DM0 pin are unused during normal write commands. In this example of a normal write command, the link ECC parity bits (E0, . . . , E15) are transferred to the memory devices 140 through the unused DM bits 260 in which "E" represents a link ECC parity bit. As a result, the memory devices 140 can recognize the link ECC parity bits 124 generated by the memory controller 110 through the DM pin.

During a mask write command, however, the DM pin is not available for carrying the link ECC parity bits 124. In aspects of the present disclosure, the link ECC parity bits 124 from the memory controller 110 are transferred between the host SoC 100 and the memory devices 140 through a mask write data byte associated with a mask write command. The location of the link ECC parity bits 124 may be communicated to the memory devices 140 using ECC bit location information. The memory devices 140 may recover ECC bits associated with the first asserted data mask (DM) bit (e.g., "H"), in which the mask write command bit fields indicate DM activity for each "m" bit data pattern. In case of a normal write operation, the memory devices recover the ECC bits from the DM data stream. In addition, during a read operation, the link ECC parity bits 124 or the memory ECC parity bits 172 are communicated through the DM pin.

In aspects of the present disclosure, a total of 16 link ECC parity bits may be available from a 128-bit data chunk (e.g., DQ byte×16 data beats). In an alternative implementation, the 16 data beats of link ECC parity bits for each 128-bit data chunk may contain more than link ECC parity bits. For example, the 16 data beats may include an 8-bit link ECC plus data bus inversion (DBI) bits and other like bits. For example, the memory controller 110 may receive timing information for improving capture of read data during the read operation. This timing information may be provided in the 16 data beats or, alternatively, may be provided over the command/address bus 134.

Figure 3A:
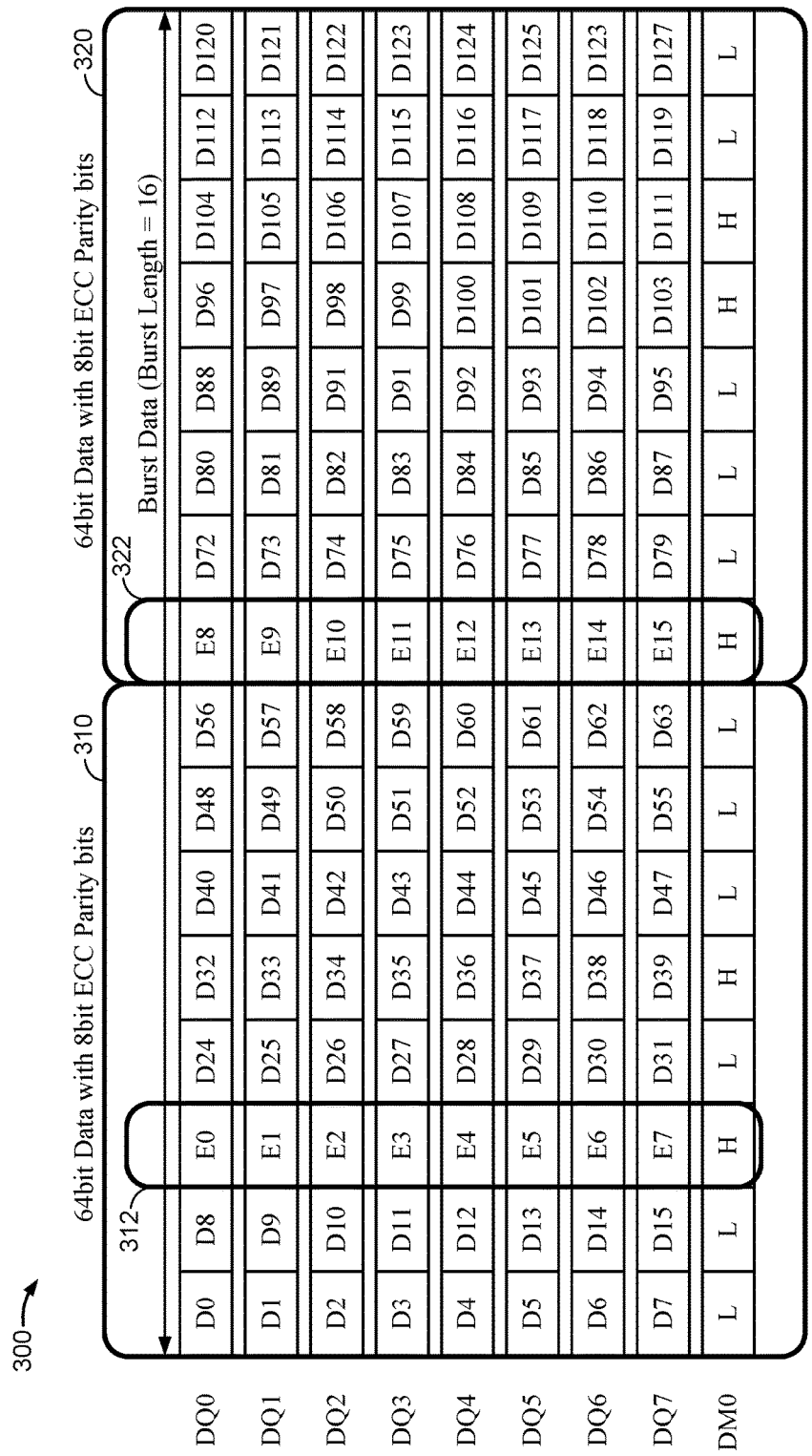
Figure 3C:
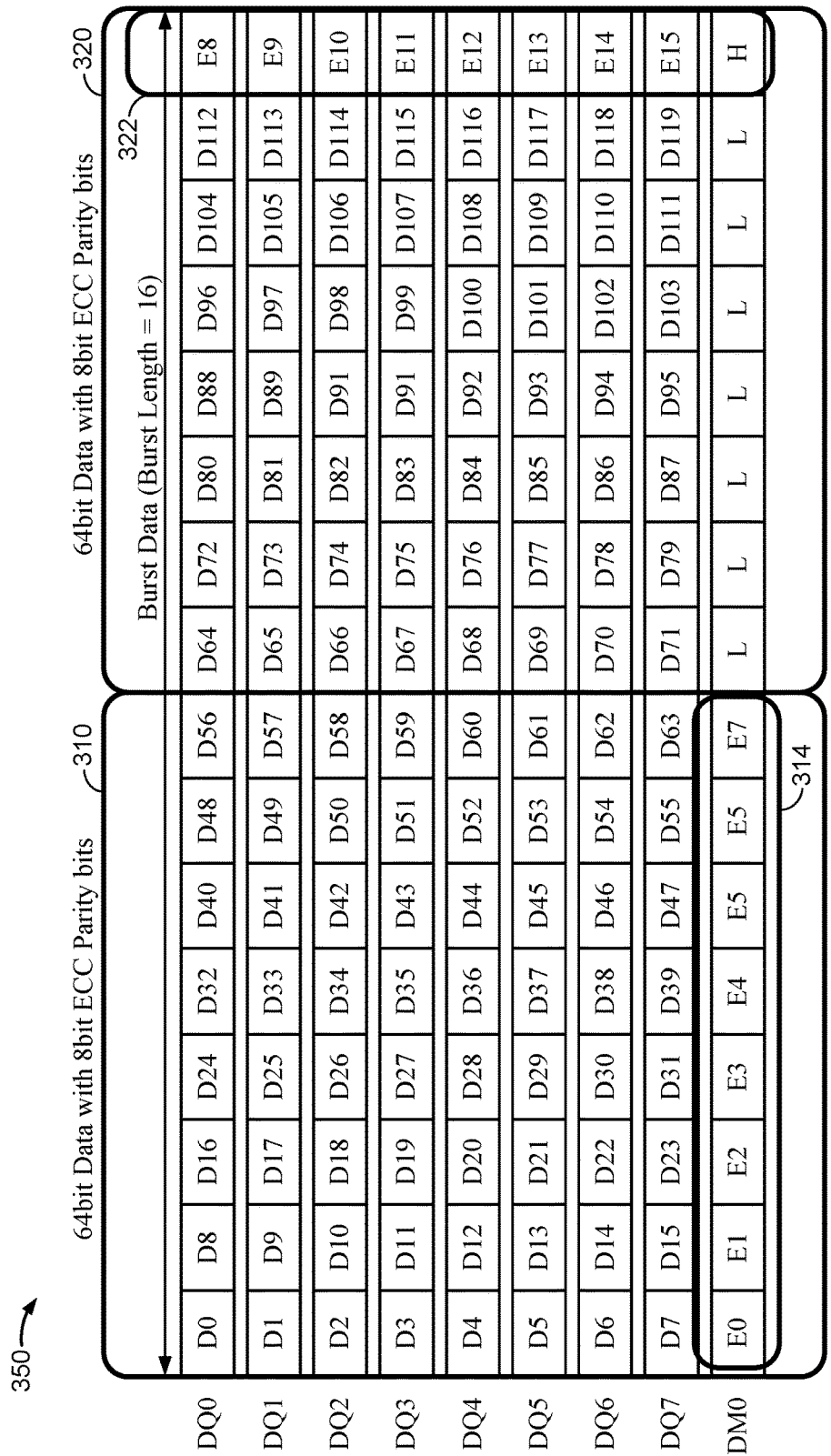

FIGS. 3A to 3C are timing diagrams illustrating various options for transferring the link ECC parity bits 124 between the host SoC 100 and the memory devices 140 during a mask write command according to aspects of the present disclosure.

FIG. 3A is a timing diagram 300 illustrating a mask write command for, for example, 128-bit write data having an associated 16-bit data mask with a burst length equal to 16. In this arrangement, the 128-bit write data is separated into first write data 310 and second write data 320 (e.g., a first 64-bit data portion with first 8-bit link ECC parity bits and a second 64-bit data portion with second 8-bit link ECC parity bits). As noted, for a mask write command, at least one data mask bit (DM0) is asserted "H" during a burst data stream (e.g., having a 64-bit burst length). In this example, a first 8-bit link ECC (e.g., E0, . . . , E7) is embedded within a first mask write data byte 312 (e.g., D<16:23>). In addition, a second 8-bit link ECC (e.g., E8, . . . , E15) is embedded within a second mask write data byte 322 (e.g., D<64:71>).

FIG. 3B is a timing diagram 330 illustrating a mask write operation for the first write data 310 combined with a normal write operation for the second write data 320. In this arrangement, a first 8-bit link ECC (e.g., E0, . . . , E7) is embedded within a first mask write data byte 312 (e.g., D<16:23>). In the second write data 320, the bits of the DM0 pin are unused for the normal write operation. In this example, the second 8-bit link ECC (e.g., E8, . . . , E15) is transferred to the memory devices 140 through second unused DM bits 324. As a result, the memory devices can recognize the link ECC parity bits 124 generated by the memory controller 110 through the first mask write data byte 312 for the first write data 310 and the second unused DM bits 324 for the second write data 320. In this aspect of the present disclosure, the host SoC 100 issues a mask write command having an extended bit field to indicate where the ECC byte is embedded: namely, the mask write data byte or the unused DM bits depending on the data mask activity.

FIG. 3C is a timing diagram 350 illustrating a normal write operation for the first write data 310 combined with a mask write operation for the second write data 320. In this arrangement, the bits of the DM0 pin are unused for the normal write operation. In this example, the first 8-bit link ECC (e.g., E0, . . . , E8) is transferred to the memory devices 140 through first unused DM bits 314. In the second write data 320, the second 8-bit link ECC (e.g., E8, . . . , E15) is embedded within a second mask write data byte 322 (e.g., D<120:127>). As a result, the memory devices can recognize the link ECC parity bits 124 generated by the memory controller 110 through the first unused DM bits 314 for the first write data 310 and the second mask write data byte 322 for the second write data 320. In this aspect of the present disclosure, the host SoC 100 also issues a mask write command having an extended bit field to indicate where ECC information is embedded: namely, the unused DM bits or the mask write data byte depending on the data mask activity.

Figure 4:
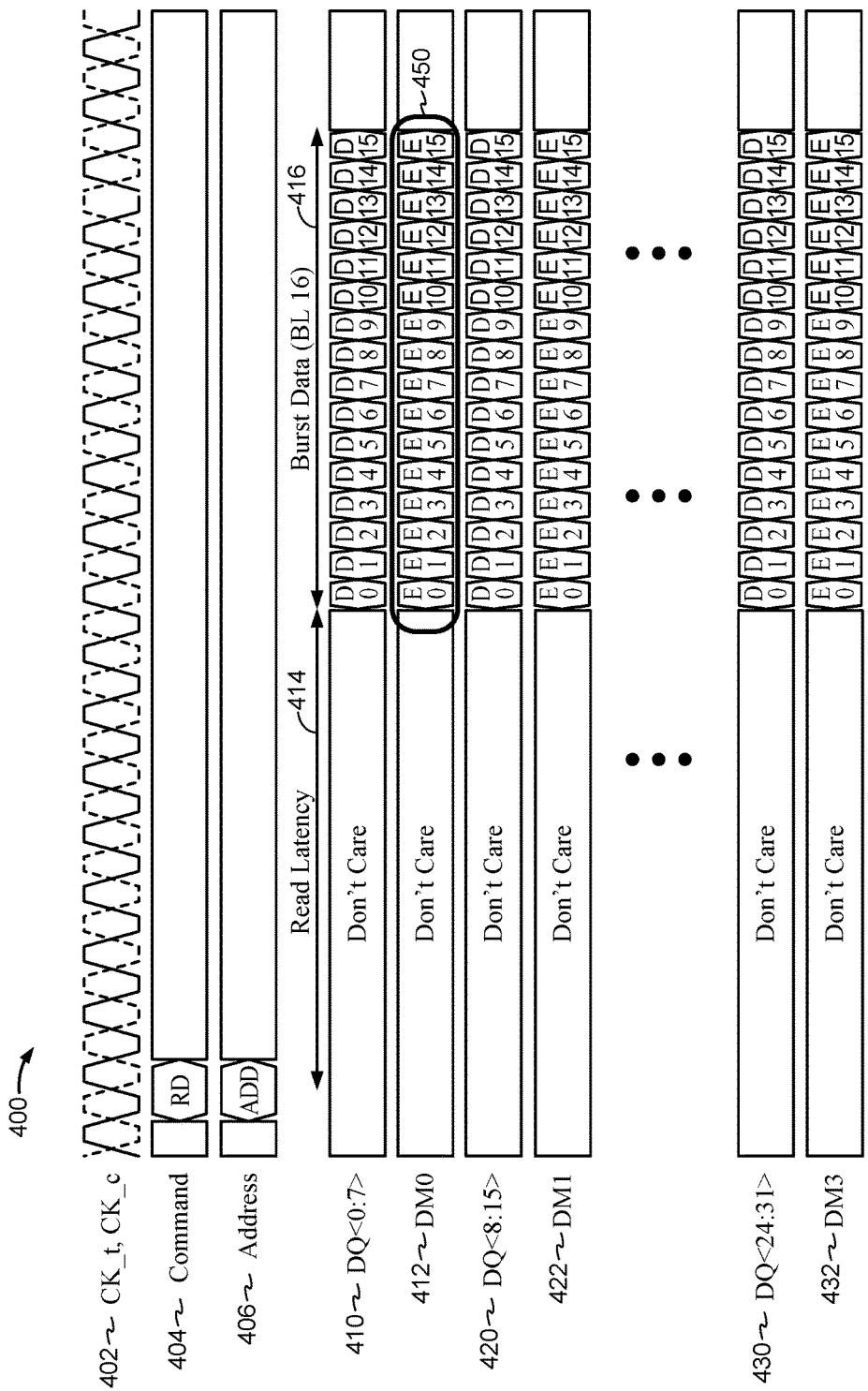
FIG. 4 is a timing diagram illustrating communication of error correction code (ECC) parity bits during a read (RD) command within a bus according to aspects of the present disclosure.

FIG. 4 is a timing diagram 400 illustrating communication of link/memory ECC parity bits during a read (RD) command within, for example, a bus having a 128-bit input/output bus width according to aspects of the present disclosure. The timing diagram 400 shows a clock signal 402, a command signal 404 and an address signal 406. The timing diagram 400 also shows a first data signal 410 and a first data mask signal 412 associated with the first data signal 410 and having an associated read latency 414 and burst data 416. For a read (RD) command, 128-bit read data and a 16-bit link/memory ECC (e.g., E0, . . . , E15) for each DQ byte (e.g., D0, . . . , D15) are transferred to the host SoC 100 from the memory cell arrays 150 using unused DM bits 450.

In one aspect of the disclosure, a memory link error during a read operation can be detected and corrected in the ECC encoder/decoder logic 120 of the memory controller 110 using the link ECC parity bits 124 from the unused DM bits 550 according to the low power memory sub-system configuration shown in FIG. 1. Alternatively, a random bit error of the read data within the memory cell array and/or a link error may be detected using the memory ECC parity bits 172 according to the low power memory sub-system configuration in which the proprietary methodology of the memory device manufacturer used to generate the memory ECC parity bits 172 is shared with the host SoC manufacturer. A second data signal 420 and an associated second data mask signal 422 as well as a fourth data signal 430 and an associated fourth data mask signal 432 are also shown.

Figure 5A:
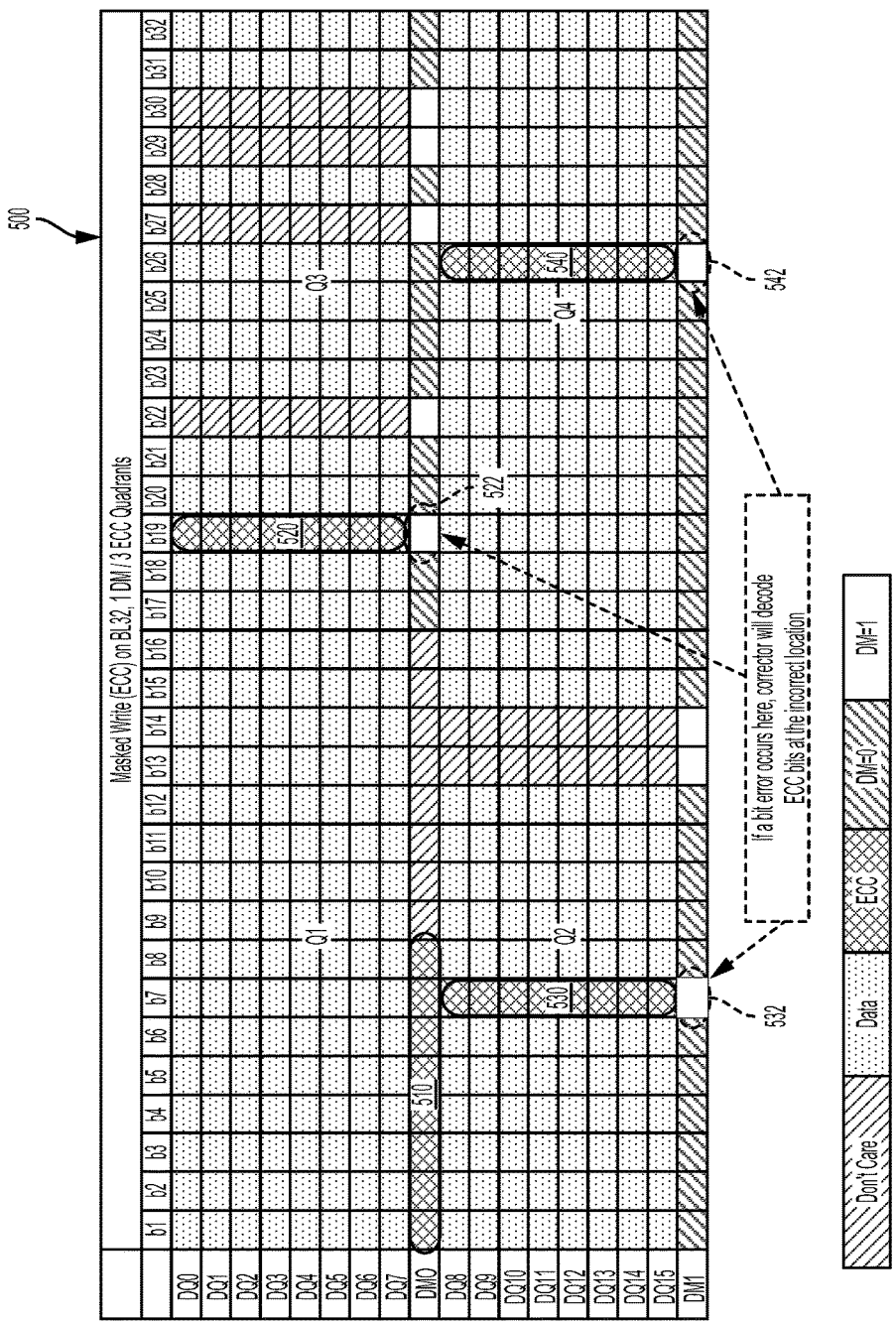
FIGS. 5A and 5B are diagrams illustrating corruption of link error correction code (ECC) parity bits transferred between a host system on chip (SoC) and low power memory devices during a mask write (MWT) command according to aspects of the present disclosure.
Figure 5B:
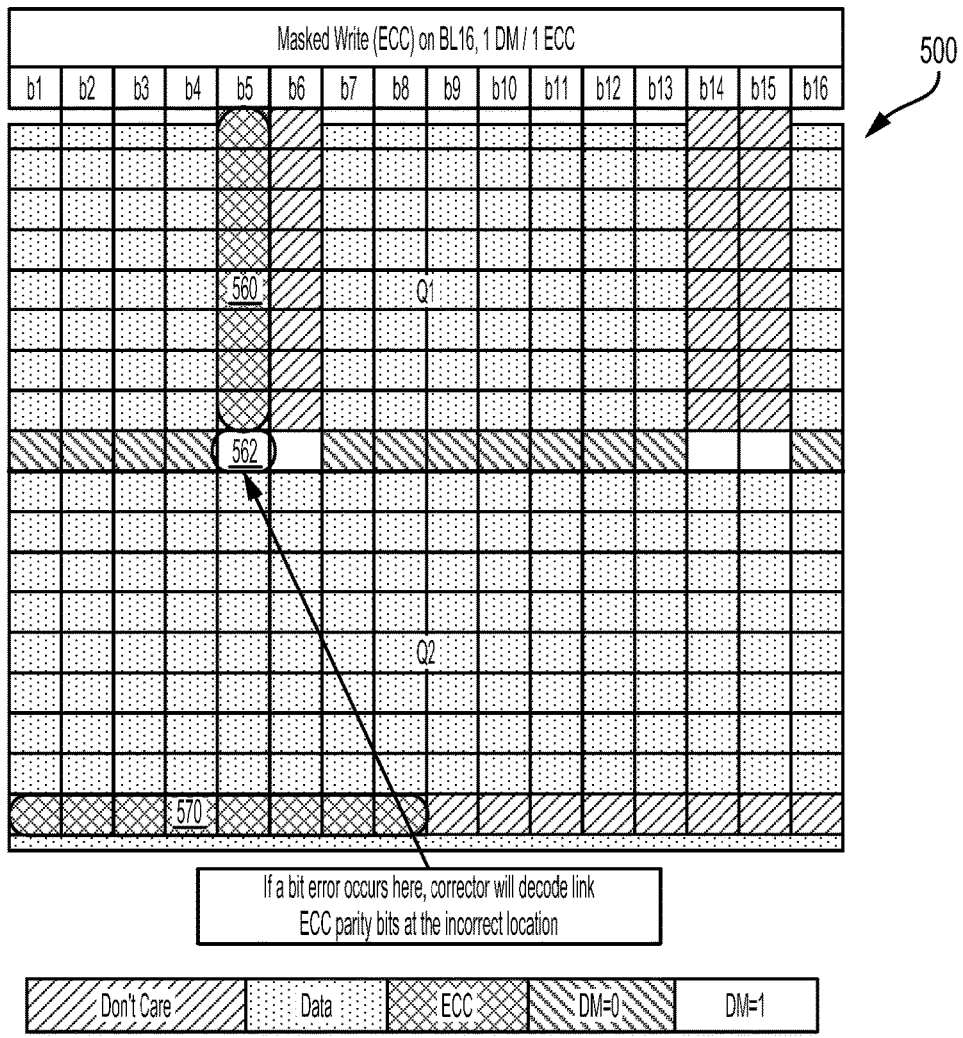

FIGS. 5A and 5B are diagrams illustrating corruption of link error correction code (ECC) parity bits transferred between a host system on chip (SoC) and low power memory devices during a mask write (MWT) command according to aspects of the present disclosure. FIG. 5A shows a masked write data burst 500 having a thirty-two (32) bit burst length (BL32) in which link ECC parity bits are transmitted over the data (DQ) pins or the data mask (DM) pins during the masked write operation. In this configuration, the masked write data burst 500 is arranged in four quadrants (Q1, Q2, Q3, and Q4). Representatively, link ECC parity bits 510 are transmitted in a first unused byte of the data mask bits DM0 in the quadrant Q1. In quadrant Q3, link ECC parity bits 520 are transmitted in a first mask write data byte corresponding to a first asserted data mask bit 522. Similarly, link ECC parity bits 530 are transmitted in the first mask write data byte corresponding to the first asserted data mask bit 532 in quadrant Q2, and link ECC parity bits 540 are transmitted in the first mask write data byte corresponding to the first asserted data mask bit 542 in quadrant Q4.

Unfortunately, if a bit error occurs on the DM bit (e.g., 522, 532, or 542) marking the location of the link ECC parity bits (e.g., 520, 530, or 540), the wrong column will be decoded at the memory device as the link ECC parity bits, resulting in link protection failure. In aspects of the present disclosure, the masked write operations protect not only the data itself with link ECC parity bits, but also the location of the link ECC parity bits, which can vary based on the number of masked write data bytes. In aspects of the present disclosure, the location of the ECC parity bits can vary, and information about that location is protected or sent separately on a lower speed line.

FIG. 5B shows a masked write data burst 550 having a sixteen (16) bit burst length in which link ECC parity bits are transmitted over the data (DQ) pins or the data mask (DM) pins during the masked write operation. In this configuration, the masked write data burst 550 is arranged in two quadrants (Q1 and Q2). Representatively, link ECC parity bits 560 are transmitted in a first mask write data byte corresponding to a first asserted data mask bit 562 in the quadrant Q1. In quadrant Q2, link ECC parity bits 570 are transmitted in a first unused byte of the data mask bits DM1. Unfortunately, if a bit error occurs on the DM bit (e.g., 562) marking the location of the link ECC parity bits (e.g., 560), the wrong column will be decoded at the memory device, resulting in link protection failure. A bit error in the link ECC parity bits 570 simply results in discarding the link ECC parity bits 570 at the link ECC decoder and correction logic 160 of the memory devices 140 (FIG. 1).

Figure 6A:
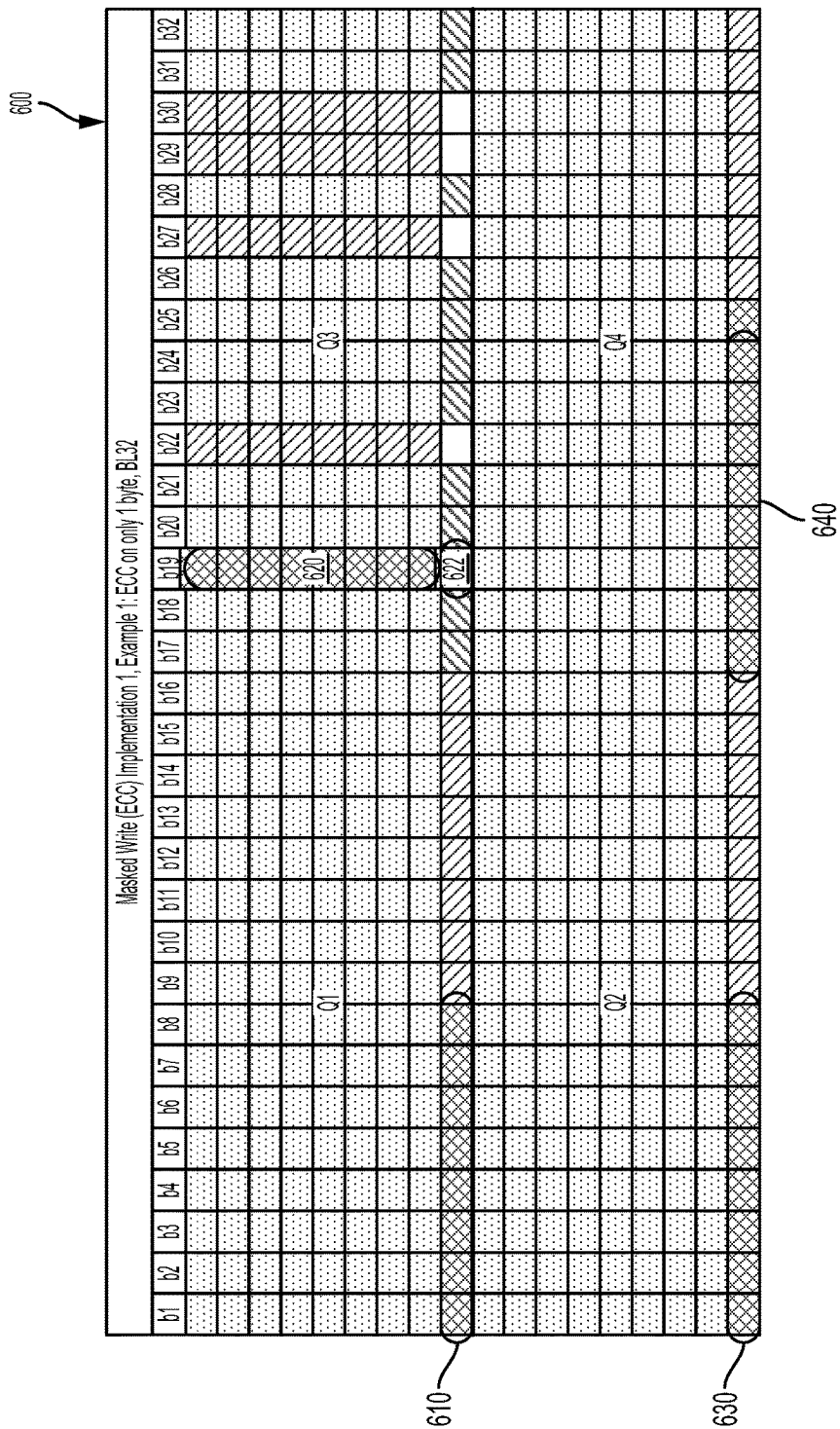
FIGS. 6A and 6B are diagrams illustrating protection of link error correction code (ECC) parity bits transferred between a host system on chip (SoC) and low power memory devices during a mask write (MWT) command according to aspects of the present disclosure.
Figure 6B:
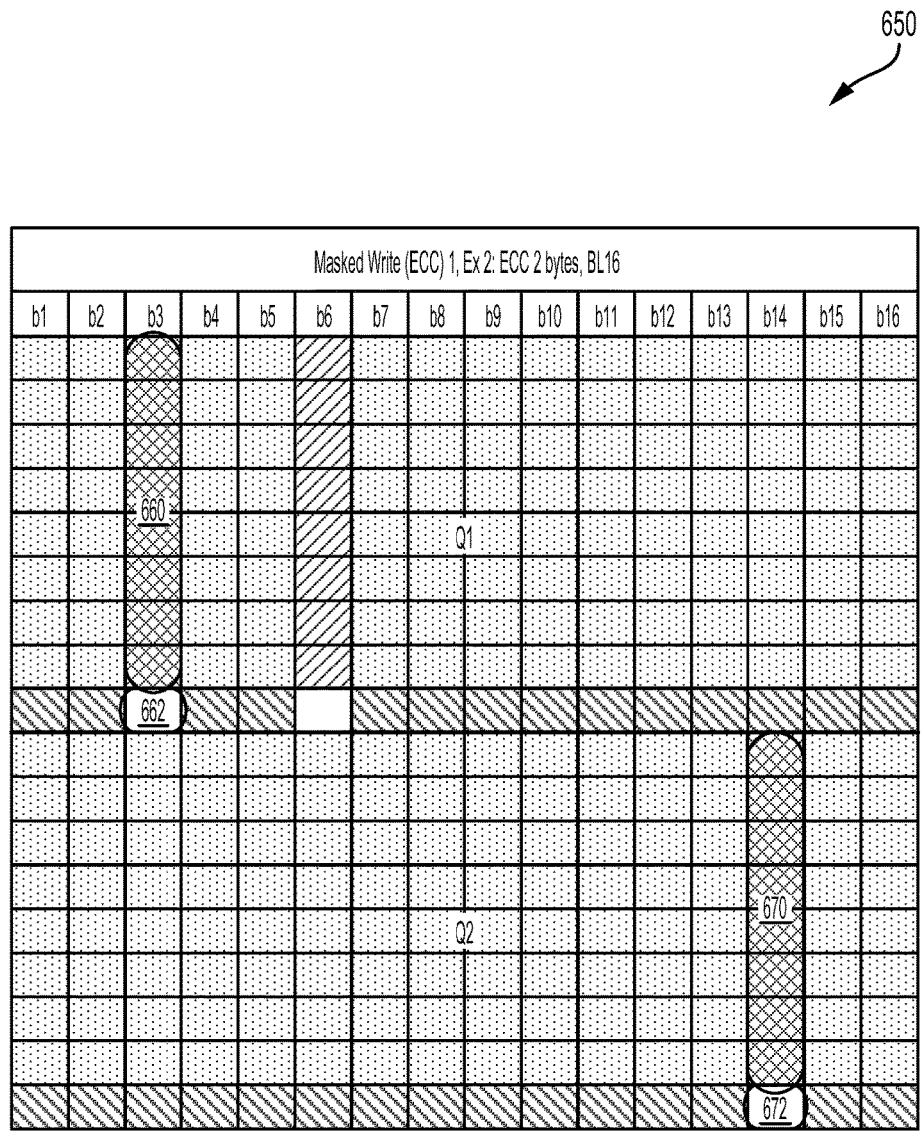

FIGS. 6A and 6B are diagrams illustrating protection of link error correction code (ECC) parity bits transferred between a host system on chip (SoC) and low power memory devices during a mask write (MWT) command according to aspects of the present disclosure. FIG. 6A shows a masked write data burst 600 having a thirty-two (32) bit burst length (BL32) in which link ECC parity bits transmitted over the data (DQ) pins or the data mask (DM) pins are protected during the masked write operation. The burst length BL32 may be referred to as predetermined burst length of the masked write data burst 600. In this configuration, link ECC parity bits 610 are transmitted in a first unused byte of the data mask bits DM0 in quadrant Q1. In quadrant Q3, link ECC parity bits 620 are transmitted in a first mask write data byte corresponding to a first asserted data mask bit 622. Similarly, link ECC parity bits 630 are transmitted in the first unused byte of the data mask bits DM1 in quadrant Q2, and link ECC parity bits 640 are transmitted in the first unused byte of the data mask bits DM1 in quadrant Q4.

Unfortunately, if a bit error occurs on the DM bit (e.g., 622) marking the location of the link ECC parity bits (e.g., 620), the wrong column (a write data byte or masked write data) will be decoded at the memory device, resulting in link protection failure. A bit error in the link ECC parity bits embedded in the unused data mask bytes (e.g., 610, 630, and 640) simply results in discarding the link ECC parity bits at the link ECC decoder and correction logic 160 of the memory devices 140 (FIG. 1). In this aspect of the present disclosure, a location of the link ECC parity bits (and the DM bits) is protected during masked write operations.

In this aspect of the disclosure, the masked write command expands from a 2-tick to a 4-tick operation to enable protection of the DM pins using the command address (CA) bus (see FIG. 1). For example, the expanded masked write command may provide twelve (12) additional bits that are available for transmission during the masked write command. For a masked write data burst 600 having a thirty-two (32) bit burst length (BL32) shown in FIG. 6A, there are sixty-four (64) DM bits to be transmitted (e.g., 32 beats for 2 bytes). In this configuration, the 64 DM pins are protected by sending a seven (7) bit single error correction (SEC) sequence or an eight (8) bit SEC double error detection (SEC-DED) bit sequence as DM ECC parity bits on the command/address bus 134 (FIG. 1) during the masked write command. The other four (4) bits provide a quadrant location code (e.g., an ECC location code) indicating if each 64-bit quadrant (e.g., Q1, Q2, Q3, or Q4) has its link ECC parity bits on the DM pins or on the DQ bits located at a DM high beat.

For example, in the BL32 masked write data burst 600 of FIG. 6A, the following twelve (12) bits would be sent over the CA bus with the mask write command:

|  |  | Q1 | Q2 | Q3 | Q4 |
|---|---|---|---|---|---|
|  | DM ECC for 64 b DM values |  |  | DM or ECC |  |
| CA bits | 8-bit ECC DM0/DM1 | 0 | 0 | 1 | 0 |

FIG. 6B shown a masked write data burst 650 having a sixteen (16) bit burst length in which link ECC parity bits transmitted over the data pins or the DM pins (e.g., DM0, DM1) are protected during the masked write operation. In this configuration, link ECC parity bits 660 are transmitted in a first mask write data byte corresponding to a first asserted data mask bit 662 in the quadrant Q1. In quadrant Q2, link ECC parity bits 670 are transmitted in a first mask write data byte corresponding to a first asserted data mask bit 672. As noted, a bit error occurring on the DM bit (e.g., 662, 672) marking the location of the link ECC parity bits (e.g., 660, 670), causes decoding of the wrong column at the memory device, resulting in link protection failure.

In this aspect of the disclosure, the link ECC parity bits (e.g., 660 and 670) are protected by expanding the masked write command from a 2-tick to a 4-tick operation to enable protection of the DM pins using the command address (CA) bus (see FIG. 1). For the masked write data burst 650 having a sixteen (16) bit burst length (BL16) shown in FIG. 6B, there are thirty-two (32) DM bits to be transmitted (e.g., 16 beats for 1 byte). In this configuration, the 32 DM pins are protected by sending a six (6) bit SEC sequence or a seven (7) SEC-DED bit sequence as DM ECC parity bits on the command/address bus 134 (FIG. 1) during the masked write command. The other two (2) bits may provide the quadrant location code indicating if each 128-bit quadrant (e.g., Q1 and Q2) has its link ECC parity bits (e.g., 660 and 670) on the DM pins or on the data bits located at a DM high beat.

For example, in the BL16 masked write data burst 650 of FIG. 6B, the following twelve (12) bits would be sent in the data mask write command, where 'X' is don't care:

|  |  | Q1 | Q2 | Q3 | Q4 |
|---|---|---|---|---|---|
|  | DM ECC for 32 b DM values |  | DM or ECC |  |  |
| CA bits | 7-bit ECC DM0/DM1 | 1 | 1 | X | X |

Figure 7A:
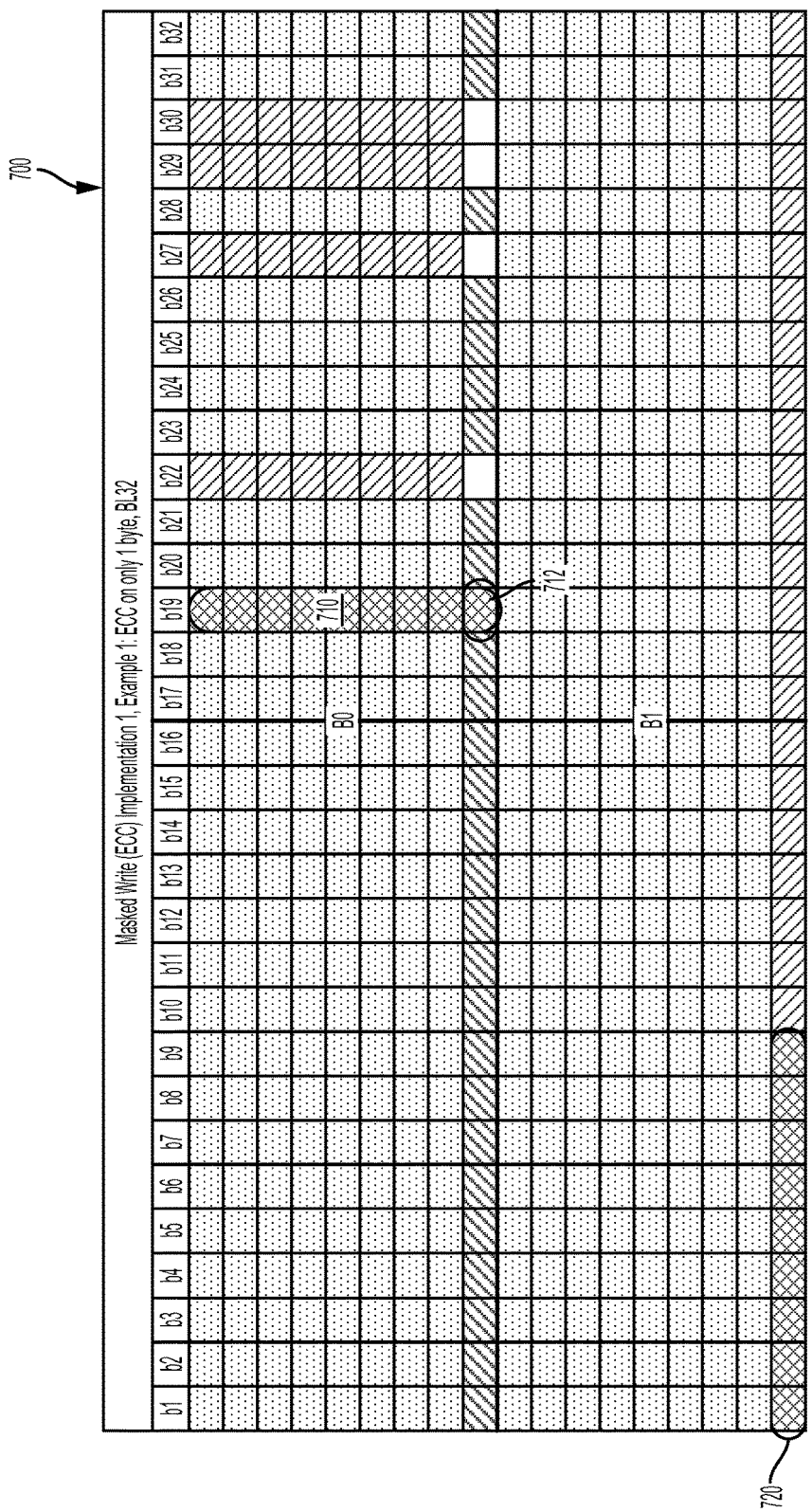
FIG. 7A is a diagram illustrating location protection of link error correction code (ECC) parity bits transferred between a host system on chip (SoC) and low power memory devices during a mask write (MWT) command according to aspects of the present disclosure.

FIG. 7A is a diagram illustrating location protection of link error correction code (ECC) parity bits transferred between a host system on chip (SoC) and low power memory devices during a mask write (MWT) command according to aspects of the present disclosure. Representatively, a BL32 masked write data burst 700 is shown having a first block B0 and a second block B1. A location of link ECC parity bits (e.g., 710, 720), which are transmitted over the data pins or the DM pins, is transmitted during the masked write operation. In this configuration, link ECC parity bits 710 are transmitted in a first mask write data byte and the corresponding data mask bit 712 of block B0 to provide link protection of block B0. In this aspect of the disclosure, the link ECC parity bits 710 are expanded (e.g., from 8-bits to 9-bits for 256-bit data), as compared to the link ECC parity bits shown in FIGS. 6A and 6B. In block B1, link ECC parity bits 720 are transmitted in first unused data mask bits. This aspect of the disclosure involves communication of the location of the link ECC parity bits (e.g., 710, 720) to enable detection of the embedded link ECC parity bits within block B0 and block B1.

In this aspect of the disclosure, the masked write command is also expanded from a 2-tick to a 4-tick operation to enable communication of the link ECC parity bit location using the CA bus (see FIG. 1). The expanded masked write command includes twelve (12) additional bits that are available for communication during the masked write command. For the BL32 masked write data burst 700 of FIG. 7A, a beat location of the link ECC parity bits (e.g., 710, 720) within the transmission is given as a five (5) bit beat location code (for BL32, 4-bit code for BL16). This 5-bit beat location code supports two (2) bytes (a maximum of 10 bits). In addition, two (2) bits (e.g., a flag) are specified as a block location code to indicate (per byte) if the DM lines hold a DM byte or the ECC parity bits (e.g., 710, 720). This aspect of the disclosure may provide a more complicated implementation for detecting the link ECC parity bit because, in this example, the link ECC parity bits 710 also occupy the data mask bit 712.

For example, in the BL32 masked write data burst 700 of FIG. 7A, the following twelve (12) bits would be sent over the CA bus with the mask write command, where 'X' is don't care:

| | Location B0 | | | | Location B1 | | | | | B0 B1 DM/ECC | |
|---|---|---|---|---|---|---|---|---|---|---|---|
| CA bits | 1 | 0 | 0 | 1 | 1 | X | X | X | X | X | 1 | 0 |

In this example, the binary bit sequence 10011 identifies bit nineteen (b19) in block B0 as including the ECC parity bits (e.g., 710). Conversely, the don't care bits 'X' and the ECC bit for B1 (ECC='0') within the 12-bit stream indicate that the DM bits are unused in block B1, so that the ECC parity bits (e.g., 720) are communicated in the first nine DM parity pins. By contrast, the DM bit for B0 (DM='1') indicates that the ECC parity bits are communicated in the DM pin and the mask write data byte.

Although protection of the link ECC parity bits as well as the protection of the location of the link ECC parity bits have been described, it should be recognized that aspects of the present disclosure are not limited to these configurations. Other possible implementations may exist, but they will all serve the purpose of protecting the information that provides the location in which (e.g., at which beat) the ECC data is transmitted. Because this location can vary for every data mask operation and is not predictable, the information may be transmitted separately on a lower speed line. Otherwise, some other type of protection scheme may be devised to ensure a bit error (before ECC can correct) does not corrupt the location of the link ECC parity bits.

Figure 7B:
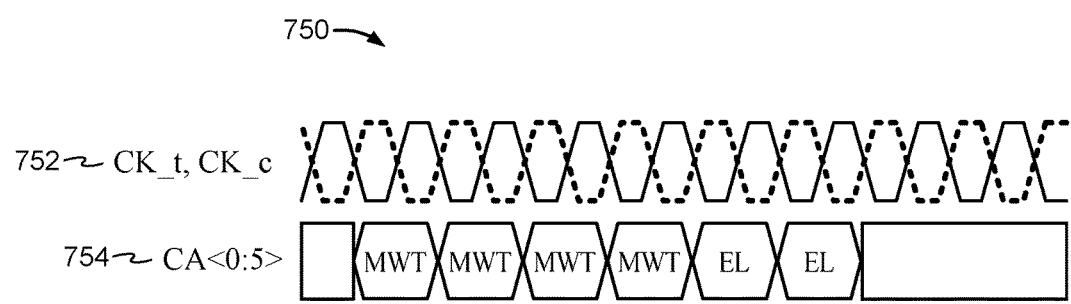
FIG. 7B shows a timing diagram for communicating link error correction code (ECC) parity bit protection information or ECC location information during a mask write command according to aspects of the present disclosure.

FIG. 7B shows a timing diagram 750 for communicating link ECC parity bit protection information or ECC location information during a mask write command according to aspects of the present disclosure. The timing diagram 750 shows a clock signal 752, and a command/address signal 754. In this aspect of the disclosure, the mask write (MW) command is followed by an ECC location command (e.g., EL bits) to indicate where the link ECC parity bits 124 are embedded in the data 122, according to the configuration shown in FIG. 7A. In an alternative configuration, the ECC location command includes DM protection bits as well as per quadrant ECC location identification bits according to the configurations shown in FIGS. 6A and 6B.

Figure 8A:
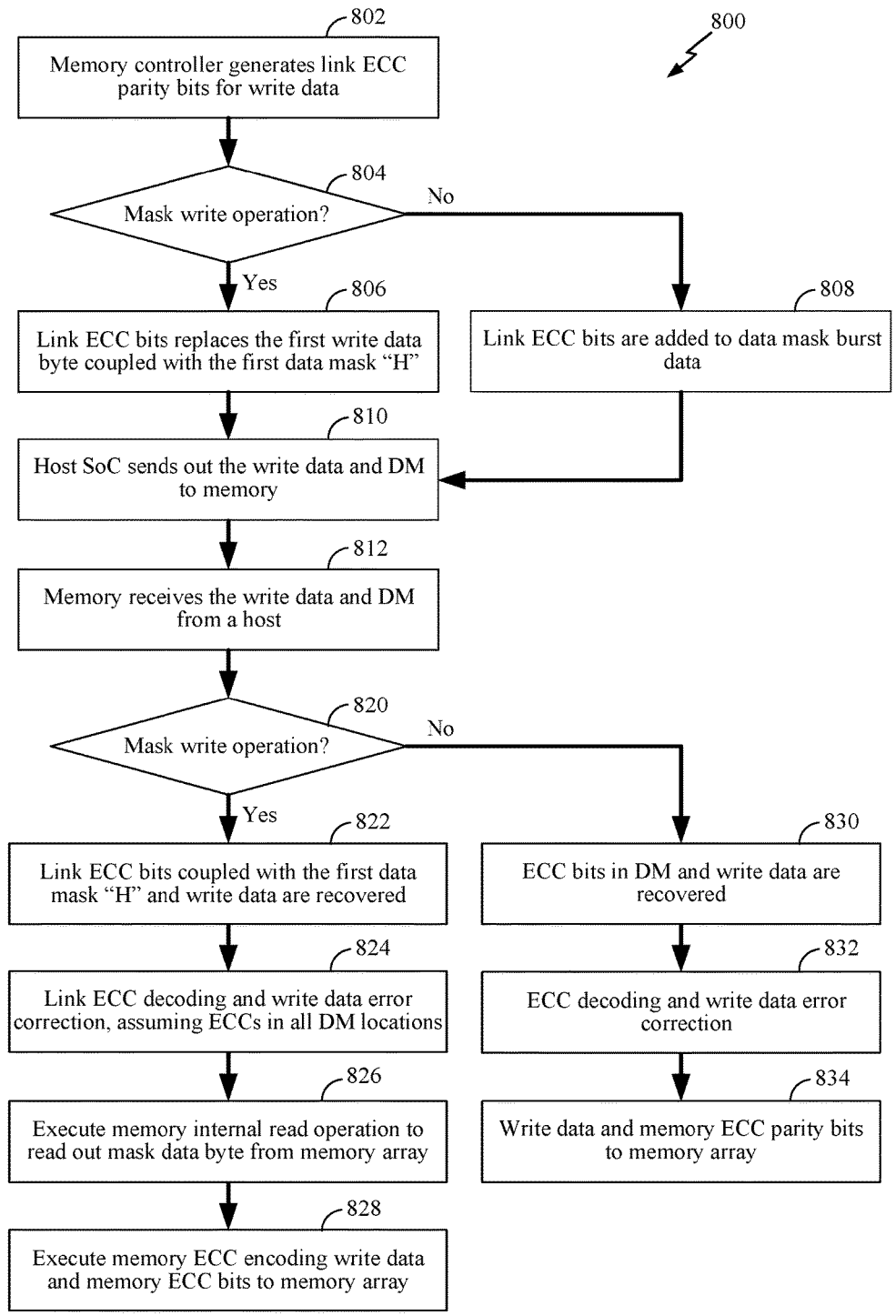
FIGS. 8A and 8B are flow diagrams illustrating methods for communication and location protection of error correction code (ECC) parity bits during a mask write (MWT) command, a normal write command and a read (RD) command according to aspects of the disclosure.

FIG. 8A is a flow diagram illustrating a method of memory cell array and link error correction in a low power memory sub-system according to aspects of the disclosure. The method 800 begins at block 802 in which a memory controller generates link ECC parity bits for write data (e.g., 8-bit/9-bit ECC parity bits for 64-bit/128-bit write data). At block 804, it is determined whether a mask write operation is being performed. When a normal write operation is being performed, the link ECC parity bits are added to the data mask burst data, at block 808. For example, as shown in FIG. 2B, the link ECC parity bits (E0, . . . , E15) are transferred to the memory devices 140 through the unused DM pins (e.g., the 260).

For a mask write command, the link ECC parity bits replace the first mask write data byte associated with a first asserted data mask bit, at block 806. For example, as shown in FIG. 3A, a first 8-bit link ECC (e.g., E0, . . . , E7) is embedded within a first mask write data byte 312 (e.g., D<16:23>). According to the configuration shown in FIGS. 6A and 6B, a method of link error correction and protection in a low power memory sub-system may include transmitting data mask ECC parity bits during the mask write operation to protect the first asserted data mask bit identifying the link ECC parity bits embedded in a corresponding mask write data byte. The method also includes transmitting an ECC location code (e.g., a quadrant location code) of the link ECC parity bits within a predetermined burst length of write data during the mask write operation. According to the configuration shown in FIG. 7A, the method may include transmitting a beat location code indicating the block location of the link ECC parity bits within a predetermined burst length of write data during the mask write operation, and transmitting a block location code indicating whether the link ECC parity bits are embedded in a data portion or the data mask portion of the predetermined burst length of write data.

Referring again to FIG. 8A, at block 810 the host (e.g., SoC) sends out the write data and the data mask to a target memory device. At block 812, the target memory device receives the write data and the data mask from the host. At block 820, it is determined whether a mask write operation is being performed. When a normal write operation is being performed, process blocks 830 to 834 execute to complete the normal write command. For a mask write command, process blocks 822 to 828 execute to complete the mask write command. In this aspect of the present disclosure, the memory devices 140 may be configured for reading link error correction code (ECC) parity bits within unused data mask bits during a normal write operation or within a mask write data byte corresponding to an asserted data mask bit during a mask write operation.

Figure 8B:
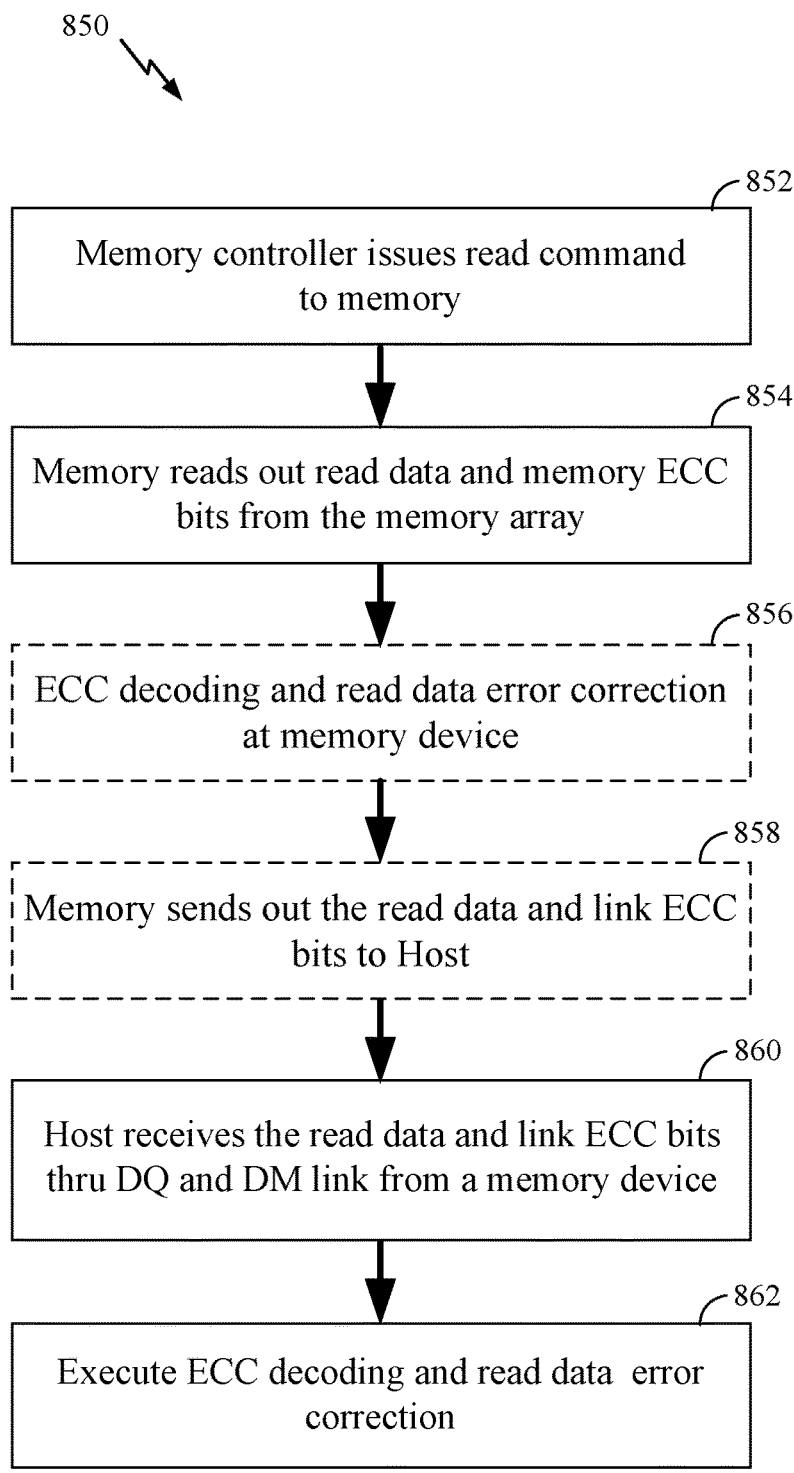

FIG. 8B is a flow diagram illustrating a method 850 for a read operation in a low power memory sub-system according to aspects of the disclosure. At block 852, a memory controller issues a read command to a target memory device. At block 854, the target memory device reads the read data from a memory cell array and memory ECC bits from an ECC array. In the read operation, optionally, blocks 856 and 858 for memory ECC decoding and read data error correction may be skipped to simplify memory implementation and to accelerate a read speed (e.g., lower read latency from read command) because the memory controller can recover the bit error caused in the memory cell array using an ECC encoder/decoder at blocks 860 and 862. It is a trade-off between memory performance (latency) and memory sub-system reliability (memory cell array bit error+read link error).

In one configuration, a low power memory sub-system includes means for embedding link error correction code (ECC) parity bits in unused data mask bits and/or in mask write data during a mask write operation. The low power memory sub-system also includes means for protecting at least a location of the link ECC parity bits during the mask write operation. In one aspect of the disclosure, the embedding means is the memory controller 110 of FIG. 1, configured to perform the functions recited by the embedding means. In one aspect of the disclosure, the protecting means is the ECC encoder/decoder logic 120 of FIG. 1, configured to perform the functions recited by the protecting means.

The memory controller 110 of FIG. 1 may also provide a means for transmitting data mask ECC parity bits to protect at least a first asserted data mask bit identifying the link ECC parity bits embedded in a corresponding mask write data byte and an ECC location code (e.g., a quadrant location code) of the link ECC parity bits within a predetermined burst length of write data over a command/address bus during the mask write operation. In addition the memory controller 110 may also provide means for transmitting a beat location code indicating the block location of the link ECC parity bits within a predetermined burst length of write data and a block location code indicating whether the link ECC parity bits are embedded in a data portion or the data mask portion of the predetermined burst length of write data over a command/address bus during the mask write operation. In another aspect, the aforementioned means may be a device or any layer configured to perform the functions recited by the aforementioned means.

Aspects of the present disclosure describe a technique in which the link ECC parity bits are transmitted over the data (DQ) pins or the data mask (DM) pins during a masked write operation. Unfortunately, when a bit error occurs on the DM bit marking the location of link ECC parity, the bit error results in the wrong column being decoded and a failure of the link ECC parity bits. In aspects of the present disclosure, masked write operations are expanded to protect both the write data using the link ECC parity bits, but also the location of the link ECC parity bits. In normal write operations, the location of the link ECC data is always known and predictable. In a read operation, the memory controller may recover memory/link ECC parity bits within the DM data stream from the memory device.

In a masked write operation, however, the location of the link ECC parity bits varies based on the number of masked bytes. In one aspect of the present disclosure, information about the location of the link ECC parity bits may be either protected or communicated separately on a lower speed (or otherwise more reliable) line. In this aspect of the disclosure, the mask write command is followed by data mask (DM) ECC parity bits to protect the DM pins in the write data burst. In another aspect of the present disclosure, a location of the ECC parity bits is transmitted with the mask write command to indicate the location in which the link ECC parity bits are embedded in the write data burst.

Figure 9:
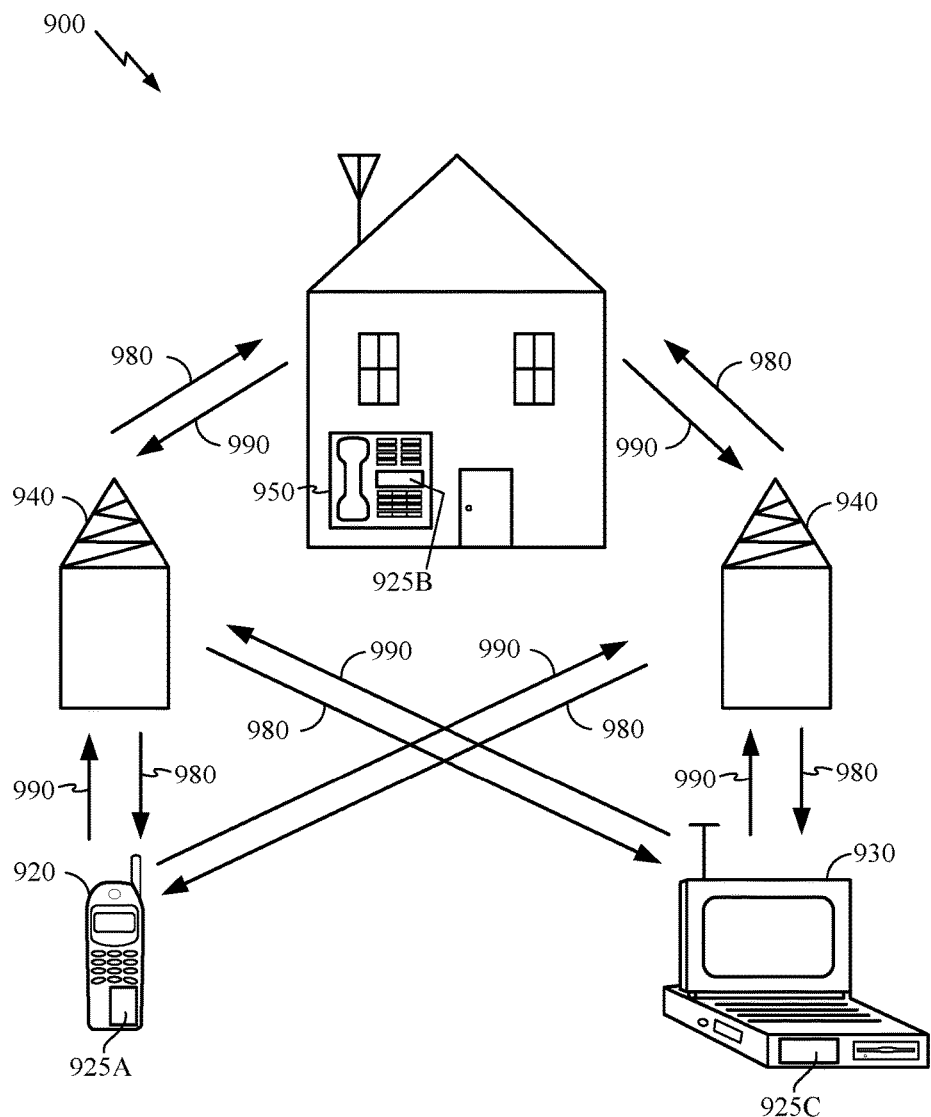
FIG. 9 is a block diagram showing a wireless communication system in which a configuration of the disclosure may be advantageously employed.

FIG. 9 is a block diagram showing an exemplary wireless communication system 900 in which a configuration of the disclosure may be advantageously employed. For purposes of illustration, FIG. 9 shows three remote units 920, 930, and 950 and two base stations 940. It will be recognized that wireless communication systems may have many more remote units and base stations. Remote units 920, 930, and 950 include IC devices 925A, 925B, and 925C, which include the disclosed low power memory sub-system. It will be recognized that any device containing an IC may also include the disclosed low power memory sub-system, including the base stations, switching devices, and network equipment. FIG. 9 shows forward link signals 980 from the base station 940 to the remote units 920, 930, and 950 and reverse link signals 990 from the remote units 920, 930, and 950 to base stations 940.

In FIG. 9, a remote unit 920 is shown as a mobile telephone, a remote unit 930 is shown as a portable computer, and a remote unit 950 is shown as a fixed location remote unit in a wireless local loop system. For example, the remote units may be a mobile phone, a hand-held personal communication systems (PCS) unit, a portable data unit such as a personal data assistant, a GPS enabled device, a navigation device, a set top box, a music player, a video player, an entertainment unit, a fixed location data unit such as a meter reading equipment, or any other device that stores or retrieves data or computer instructions, or any combination thereof. For example, a remote unit including the low power memory sub-system may be integrated within a vehicle control system, a server computing system or other like system specifying critical data integrity. Although FIG. 9 illustrates IC devices 925A, 925B, and 925C, which include the disclosed a low power memory sub-system, the disclosure is not limited to these exemplary illustrated units. Aspects of the present disclosure may be suitably employed in any device, which includes the low power memory sub-system.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to any type of long term, short term, volatile, nonvolatile, or other memory and is not to be limited to any particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD) and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general-purpose or special-purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD) and Blu-ray disc where disks usually reproduce data magnetically, while discs reproduce data optically with lasers. Combinations of the above should also be included within the scope of computer-readable media.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "a step for."

What is claimed is:

1. A method of link error correction and protection in a low power memory sub-system, comprising:
    embedding link error correction code (ECC) parity bits in unused data mask bits and/or in a mask write data during a mask write operation; and
    protecting at least a location of the link ECC parity bits in either the unused data mask bits or the mask write data against a link error during the mask write operation by identifying the unused data mask bits or the mask write data during the mask write operation as the location of the link ECC parity bits.

2. The method of claim 1, in which protecting at least the location of the link ECC parity bits comprises transmitting data mask ECC parity bits during the mask write operation to protect at least a first asserted data mask bit identifying the link ECC parity bits embedded in a corresponding mask write data byte.

3. The method of claim 2, further comprising transmitting an ECC location code of the link ECC parity bits within a predetermined burst length of write data during the mask write operation.

4. The method of claim 3, further comprising transmitting the data mask ECC parity bits and the ECC location code of the link ECC parity bits over a command/address bus during the mask write operation.

5. The method of claim 1, in which embedding during the mask write operation comprises:
    determining whether a predetermined burst length of write data includes an asserted data mask bit;

embedding the link ECC parity bits in a first mask write data byte corresponding to the first asserted data mask bit and within the first asserted data mask bit; and otherwise, embedding the link ECC parity bits in the unused data mask bits.

6. The method of claim 1, in which protecting at least the location of the link ECC parity bits comprises transmitting a beat location code indicating a block location of the link ECC parity bits within a predetermined burst length of write data during the mask write operation.

7. The method of claim 6, further comprising transmitting a block location code indicating whether the link ECC parity bits are embedded in a data portion or the data mask portion of the predetermined burst length of write data.

8. The method of claim 7, further comprising transmitting the beat location code and the block location code over a command/address bus during the mask write operation.

9. The method of claim 1, further comprising receiving timing information for capture of read data during a read operation.

10. The method of claim 1, further comprising integrating the low power memory sub-system into a mobile phone, a set top box, a music player, a video player, an entertainment unit, a navigation device, a computer, a hand-held personal communication systems (PCS) unit, a portable data unit, a fixed location data unit, a server computing system and/or a vehicle control system.

11. A memory sub-system, comprising:
a memory controller having error correction code (ECC) encoder/decoder logic, the memory controller configured to embed link ECC parity bits in unused data mask bits and/or in a mask write data during a mask write operation and configured to protect at least a location of the link ECC parity bits in either the unused data mask bits or the mask write data against a link error during the mask write operation by identifying the unused data mask bits or the mask write data during the mask write operation as the location of the link ECC parity bits.

12. The memory sub-system of claim 11, in which the memory controller is further configured to transmit data mask ECC parity bits during the mask write operation to protect at least a first asserted data mask bit identifying the link ECC parity bits embedded in a corresponding mask write data byte and to transmit an ECC location code of the link ECC parity bits within a predetermined burst length of write data during the mask write operation.

13. The memory sub-system of claim 12, in which the memory controller is further configured to transmit the data mask ECC parity bits and the ECC location code of the link ECC parity bits over a command/address bus during the mask write operation.

14. The memory sub-system of claim 11, in which the memory controller is further configured to transmit a beat location code indicating a block location of the link ECC parity bits within a predetermined burst length of write data during the mask write operation and to transmit a block location code indicating whether the link ECC parity bits are embedded in a data portion or the data mask portion of the predetermined burst length of write data.

15. The memory sub-system of claim 14, in which the memory controller is further configured to transmit the beat location code and the block location code over a command/address bus during the mask write operation.

16. The memory sub-system of claim 15, in which the memory controller is further configured to determine whether the predetermined burst length of write data includes an asserted data mask bit, to embed the link ECC parity bits in a first mask write data byte corresponding to the first asserted data mask bit and within the first asserted data mask bit and to otherwise embed the link ECC parity bits in the unused data mask bits.

17. The memory sub-system of claim 11, in which the memory controller is further configured to receive timing information for improving capture of read data during a read operation.

18. The memory sub-system of claim 11 integrated into a mobile phone, a set top box, a music player, a video player, an entertainment unit, a navigation device, a computer, a hand-held personal communication systems (PCS) unit, a portable data unit, a fixed location data unit, a server computing system and/or a vehicle control system.

19. A memory sub-system, comprising:
a memory controller having error correction code (ECC) encoder/decoder logic configured to embed link ECC parity bits in unused data mask bits and/or in a mask write data during a mask write operation and configured to protect at least a location of the link ECC parity bits in either the unused data mask bits or the mask write data against a link error during the mask write operation by identifying the unused data mask bits or the mask write data during the mask write operation as the location of the link ECC parity bits; and
a memory device coupled to the memory controller via at least a data bus, comprising:
link ECC decoder and correction logic in a write path and configured for detection and correction of link errors during transmission of write data over the data bus; and
memory ECC encoder logic in the write path and configured for memory protection of the write data during storage within a memory array according to memory ECC parity bits.

20. The memory sub-system of claim 19, in which the memory controller is further configured to transmit data mask ECC parity bits during the mask write operation to protect at least a first asserted data mask bit identifying the link ECC parity bits embedded in a corresponding mask write data byte and to transmit an ECC location code of the link ECC parity bits within a predetermined burst length of write data during the mask write operation.

21. The memory sub-system of claim 20, in which the memory controller is further configured to transmit the data mask ECC parity bits and the ECC location code of the link ECC parity bits over a command/address bus during the mask write operation.

22. The memory sub-system of claim 19, in which the memory controller is further configured to transmit a beat location code indicating a block location of the link ECC parity bits within a predetermined burst length of write data during the mask write operation and to transmit a block location code indicating whether the link ECC parity bits are embedded in a data portion or the data mask portion of the predetermined burst length of write data.

23. The memory sub-system of claim 22, in which the memory controller is further configured to transmit the beat location code and the block location code over a command/address bus during the mask write operation.

24. The memory sub-system of claim 19, in which the memory controller is further configured to determine whether a predetermined burst length of write data includes an asserted data mask bit, to embed the link ECC parity bits in a first mask write data byte corresponding to the first asserted data mask bit and within the first asserted data mask bit and to otherwise embed the ECC parity bits in the unused data mask bits.

25. The memory sub-system of claim 19, in which the memory controller is further configured to receive timing information for improving capture of read data during a read operation.

26. The memory sub-system of claim 19 integrated into a mobile phone, a set top box, a music player, a video player, an entertainment unit, a navigation device, a computer, a hand-held personal communication systems (PCS) unit, a portable data unit, a fixed location data unit, a server computing system and/or a vehicle control system.

27. A memory sub-system, comprising:
   means for embedding link error correction code (ECC) parity bits in unused data mask bits and/or in mask write data during a mask write operation; and
   means for protecting at least a location of the link ECC parity bits in either the unused data mask bits or the mask write data against a link error during the mask write operation by identifying the unused data mask bits or the mask write data during the mask write operation as the location of the link ECC parity bits.

28. The memory sub-system of claim 27, further comprising means for transmitting data mask ECC parity bits to protect at least a first asserted data mask bit identifying the link ECC parity bits embedded in a corresponding mask write data byte and an ECC location code of the link ECC parity bits within a predetermined burst length of write data over a command/address bus during the mask write operation.

29. The memory sub-system of claim 27, further comprising means for transmitting a beat location code indicating the block location of the link ECC parity bits within a predetermined burst length of write data and a block location code indicating whether the link ECC parity bits are embedded in a data portion or the data mask portion of the predetermined burst length of write data over a command/address bus during the mask write operation.

30. The memory sub-system of claim 27 integrated into a mobile phone, a set top box, a music player, a video player, an entertainment unit, a navigation device, a computer, a hand-held personal communication systems (PCS) unit, a portable data unit, a fixed location data unit, a server computing system and/or a vehicle control system.

* * * * *